US012635566B2

(12) United States Patent
Yeh et al.

(10) Patent No.: US 12,635,566 B2
(45) Date of Patent: May 19, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Der-Chyang Yeh, Hsinchu (TW); Sung-Feng Yeh, Taipei City (TW); Jian-Wei Hong, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 836 days.

(21) Appl. No.: 17/865,969

(22) Filed: Jul. 15, 2022

(65) Prior Publication Data

US 2023/0335534 A1     Oct. 19, 2023

Related U.S. Application Data

(60) Provisional application No. 63/362,922, filed on Apr. 13, 2022.

(51) Int. Cl.
| | |
|---|---|
| *H01L 25/065* | (2023.01) |
| *H01L 23/00* | (2006.01) |
| *H01L 23/31* | (2006.01) |
| *H01L 25/00* | (2006.01) |

(52) U.S. Cl.
CPC ...... *H01L 25/0657* (2013.01); *H01L 23/3121* (2013.01); *H01L 24/97* (2013.01); *H01L 25/50* (2013.01)

(58) Field of Classification Search
CPC . H01L 25/0657; H01L 23/3121; H01L 24/97; H01L 25/50; H01L 2221/68345; H01L 2221/68368; H01L 2225/06586; H01L 21/6835; H01L 2225/06541
See application file for complete search history.

(56) References Cited

U.S. PATENT DOCUMENTS

| | | | |
|---|---|---|---|
| 7,993,983 B1 * | 8/2011 | Lin | H01L 24/32 438/126 |
| 8,993,380 B2 | 3/2015 | Hou et al. | |
| 9,281,254 B2 | 3/2016 | Yu et al. | |
| 9,299,649 B2 | 3/2016 | Chiu et al. | |

(Continued)

FOREIGN PATENT DOCUMENTS

| | | |
|---|---|---|
| TW | 573324 B | 1/2004 |
| TW | 202010085 A | 3/2020 |

(Continued)

*Primary Examiner* — Eliseo Ramos Feliciano
*Assistant Examiner* — Thaddeus J Kolb
(74) *Attorney, Agent, or Firm* — Slater Matsil, LLP

(57) ABSTRACT

In an embodiment, a device includes: a first integrated circuit die; a second integrated circuit die bonded to the first integrated circuit die in a face-to-back manner; a dummy semiconductor feature adjacent the second integrated circuit die and bonded to the first integrated circuit die; a support substrate attached to the dummy semiconductor feature and the second integrated circuit die; and a passivation layer extending along a top surface of the support substrate, an outer sidewall of the dummy semiconductor feature, an outer sidewall of the first integrated circuit die, and a top surface of the first integrated circuit die.

20 Claims, 27 Drawing Sheets

(56)       References Cited

U.S. PATENT DOCUMENTS

| | | | |
|---|---|---|---|
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 10,658,332 | B2 | 5/2020 | Sung et al. |
| 11,164,855 | B2 | 11/2021 | Chen et al. |
| 11,315,860 | B2 | 4/2022 | Chu et al. |
| 2004/0253810 | A1 | 12/2004 | Wang et al. |
| 2021/0082865 | A1* | 3/2021 | Baraskar ................. H01L 24/32 |
| 2022/0351901 | A1* | 11/2022 | Newlin ............... H01L 23/3121 |
| 2023/0197685 | A1* | 6/2023 | Karhade ................. H01L 24/08 |
| | | | 257/777 |
| 2023/0197819 | A1* | 6/2023 | Bouche ............. H10D 84/0151 |
| | | | 257/401 |
| 2024/0215244 | A1* | 6/2024 | Tanaka ................... H10B 43/27 |

FOREIGN PATENT DOCUMENTS

| | | | |
|---|---|---|---|
| TW | 202113995 | A | 4/2021 |
| TW | 202117955 | A | 5/2021 |

* cited by examiner

INTEGRATED CIRCUIT PACKAGES AND METHODS OF FORMING THE SAME

PRIORITY CLAIM AND CROSS-REFERENCE

This application claims the benefit of U.S. Provisional Application No. 63/362,922, filed on Apr. 13, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
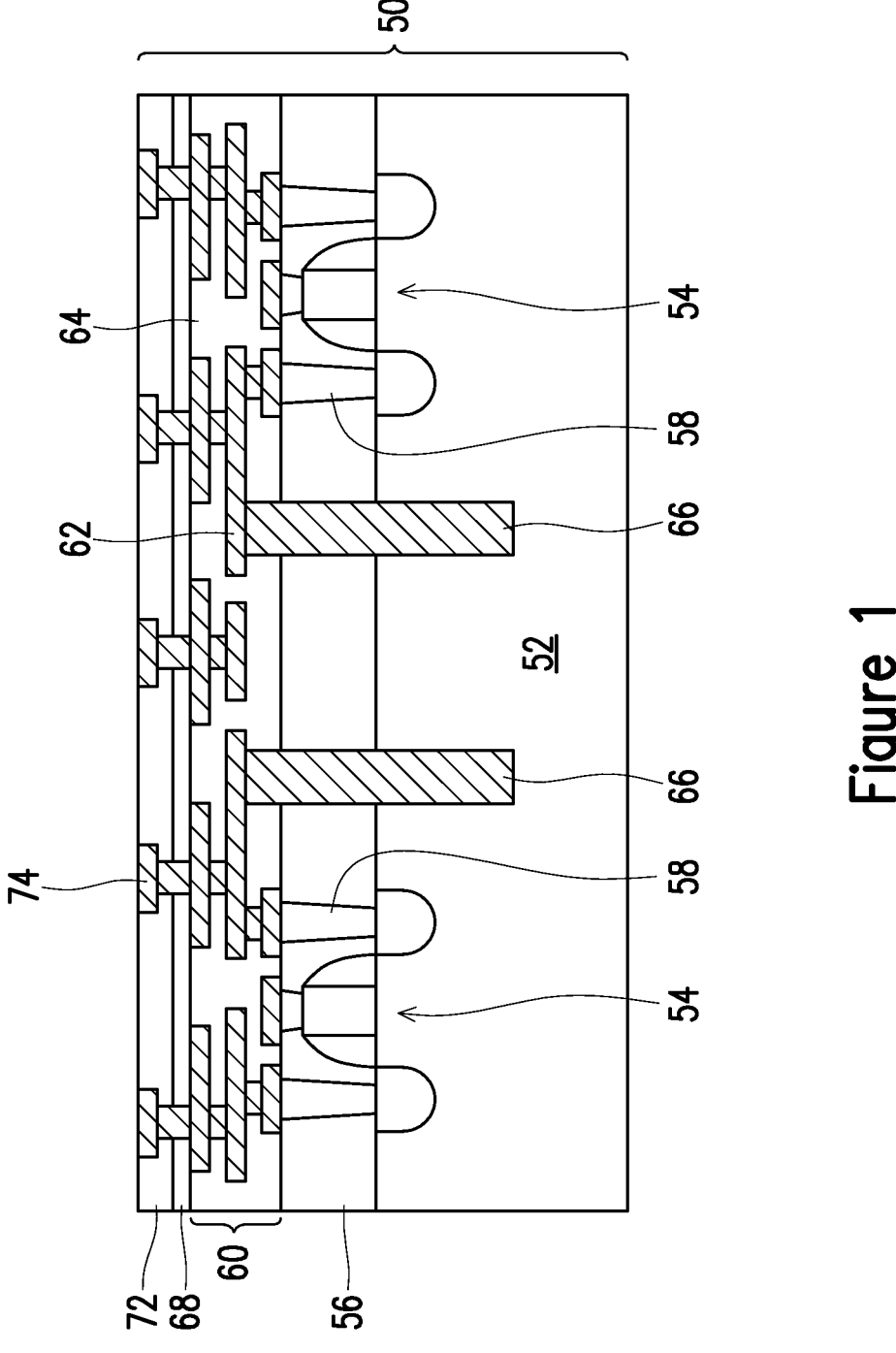
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, integrated circuit packages including gap-filling dielectrics are formed. During formation, a chemical removal process is utilized to separate the gap-filling dielectrics of adjacent integrated circuit packages. Separating the gap-filling dielectrics with a chemical removal process may reduce damage to the integrated circuit packages. Specifically, utilizing a chemical removal process (instead of a mechanical process) to separate the gap-filling dielectrics can reduce the risk of cracks forming in the gap-filling dielectrics. Reliability of the resulting integrated circuit packages during testing or operation may thus be improved.

FIG. 1 is a cross-sectional view of an integrated circuit die 50. The integrated circuit die 50 will be packaged in subsequent processing to form an integrated circuit device. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 (represented by a transistor) are disposed at the active surface of the semiconductor substrate 52. The devices 54 may be active devices (e.g., transistors, diodes, etc.), capacitors, resistors, etc. For example, the devices 54 may be transistors that include gate structures and source/drain regions, where the gate structures are on channel regions, and the source/drain regions are adjacent the channel regions. The channel regions may be patterned regions of the semiconductor substrate 52. For example, the channel regions may be regions of semiconductor fins, semiconductor nanosheets, semiconductor nanowires, or the like patterned in the semiconductor substrate 52. When the devices 54 are transistors, they may be nanostructure field-effect transistors (Nanostructure-FETs), fin field-effect transistors (FinFETs), planar transistors, or the like.

An inter-layer dielectric 56 is disposed over the active surface of the semiconductor substrate 52. The inter-layer dielectric 56 surrounds and may cover the devices 54. The inter-layer dielectric 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, which may be formed by a deposition process such as chemical vapor deposition (CVD), atomic layer deposition (ALD), or the like. Contacts 58 extend through the inter-layer dielectric 56 to electrically and physically couple the devices 54. For example, when the devices 54 are transistors, the contacts 58 may couple the gates and source/drain regions of the transistors. The contacts 58 may be formed of a suitable conductive material such as tungsten, cobalt, nickel, copper, silver, gold, aluminum, the like, or combinations thereof, which may be formed by a deposition process such as physical vapor deposition (PVD) or CVD, a plating process such as electrolytic or electroless plating, or the like.

An interconnect structure 60 is disposed over the inter-layer dielectric 56 and contacts 58. The interconnect structure 60 interconnects the devices 54 to form an integrated circuit. The interconnect structure 60 may be formed of, for example, metallization patterns 62 in dielectric layers 64. The dielectric layers 64 may be, e.g., low-k dielectric layers. The metallization patterns 62 include metal lines and vias, which may be formed in the dielectric layers 64 by a damascene process, such as a single damascene process, a dual damascene process, or the like. The metallization patterns 62 may be formed of a suitable conductive material, such as copper, tungsten, aluminum, silver, gold, a combination thereof, or the like. The metallization patterns 62 are electrically coupled to the devices 54 by the contacts 58.

The conductive vias 66 extend into the interconnect structure 60 and/or the semiconductor substrate 52. The conductive vias 66 are electrically coupled to the metallization patterns 62 of the interconnect structure 60. The conductive vias 66 may be through-substrate vias, such as through-silicon vias. As an example to form the conductive vias 66, recesses can be formed in the interconnect structure 60 and/or the semiconductor substrate 52 by, for example, etching, milling, laser techniques, a combination thereof, or the like. A thin barrier layer may be conformally deposited in the recesses, such as by CVD, atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer is removed from a surface of the interconnect structure 60 or the semiconductor substrate 52 by, for example, a chemical-mechanical polish (CMP). The remaining portions of the barrier layer and conductive material in the recesses form the conductive vias 66.

In this embodiment, the conductive vias 66 are formed by a via-middle process, such that the conductive vias 66 extend through a portion of the interconnect structure 60 (e.g., a subset of the dielectric layers 64) and extend into the semiconductor substrate 52. The conductive vias 66 formed by a via-middle process are connected to a middle metallization pattern 62 of the interconnect structure 60. In another embodiment, the conductive vias 66 are formed by a via-first process, such that the conductive vias 66 extend into the semiconductor substrate 52 but not the interconnect structure 60. The conductive vias 66 formed by a via-first process are connected to a lower metallization pattern 62 of the interconnect structure 60. In yet another embodiment, the conductive vias 66 are formed by a via-last process, such that the conductive vias 66 extend through an entirety of the interconnect structure 60 (e.g., each of the dielectric layers 64) and extend into the semiconductor substrate 52. The conductive vias 66 formed by a via-last process are connected to the upper metallization pattern 62 of the interconnect structure 60.

One or more passivation layer(s) 68 are disposed on the interconnect structure 60. The passivation layer(s) 68 may be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzo-cyclobutene (BCB) based polymer, molding compound, the like, or a combination thereof. The passivation layer(s) 68 may be formed by chemical vapor deposition (CVD), spin coating, lamination, the like, or a combination thereof. In some embodiments, the passivation layer(s) 68 include a silicon oxynitride layer or a silicon nitride layer.

A dielectric layer 72 is disposed on the passivation layer(s) 68. The dielectric layer 72 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; a polymer such as PBO, polyimide, a BCB-based polymer, or the like; a combination thereof; or the like. The dielectric layer 72 may be formed, for example, by CVD, spin coating, lamination, or the like. In some embodiments, the dielectric layer 72 is formed of TEOS-based silicon oxide.

Die connectors 74 extend through the dielectric layer 72 and the passivation layer(s) 68. The die connectors 74 may include conductive pillars, pads, or the like, to which external connections can be made. In some embodiments, the die connectors 74 include bond pads at the front-side surface of the integrated circuit die 50, and include bond pad vias that connect the bond pads to the upper metallization pattern 62 of the interconnect structure 60. In such embodiments, the die connectors 74 (including the bond pads and the bond pad vias) may be formed by a damascene process, such as a single damascene process, a dual damascene process, or the like. The die connectors 74 can be formed of a conductive material, such as a metal, such as copper, aluminum, or the like, which can be formed by, for example, plating, or the like.

Optionally, solder regions (not separately illustrated) may be disposed on the die connectors 74 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 74. Chip probe testing may be performed on the integrated circuit die 50 to ascertain whether the integrated circuit die 50 is a known good die (KGD). Thus, only integrated circuit dies 50, which are KGDs, undergo subsequent processing and are packaged, and dies which fail the chip probe testing are not packaged. After testing, the solder regions may be removed in subsequent processing steps.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 60.

FIGS. 2-22 are cross-sectional views of intermediate stages in the manufacturing of integrated circuit packages 100, in accordance with some embodiments. Specifically, integrated circuit packages 100 are formed by packaging multiple integrated circuit dies 50 in respective package regions 102P. The package regions 102P are separated by scribe line regions 102S. The package regions 102P will be singulated along the scribe line regions 102S in subsequent processing to form the integrated circuit packages 100. Processing of two package regions 102P is illustrated, but it should be appreciated that any number of package regions 102P can be simultaneously processed to form any number of integrated circuit packages 100. The integrated circuit packages 100 may be system-on-integrated-chips (SoIC) devices, although other types of packages may be formed.

Figure 2:
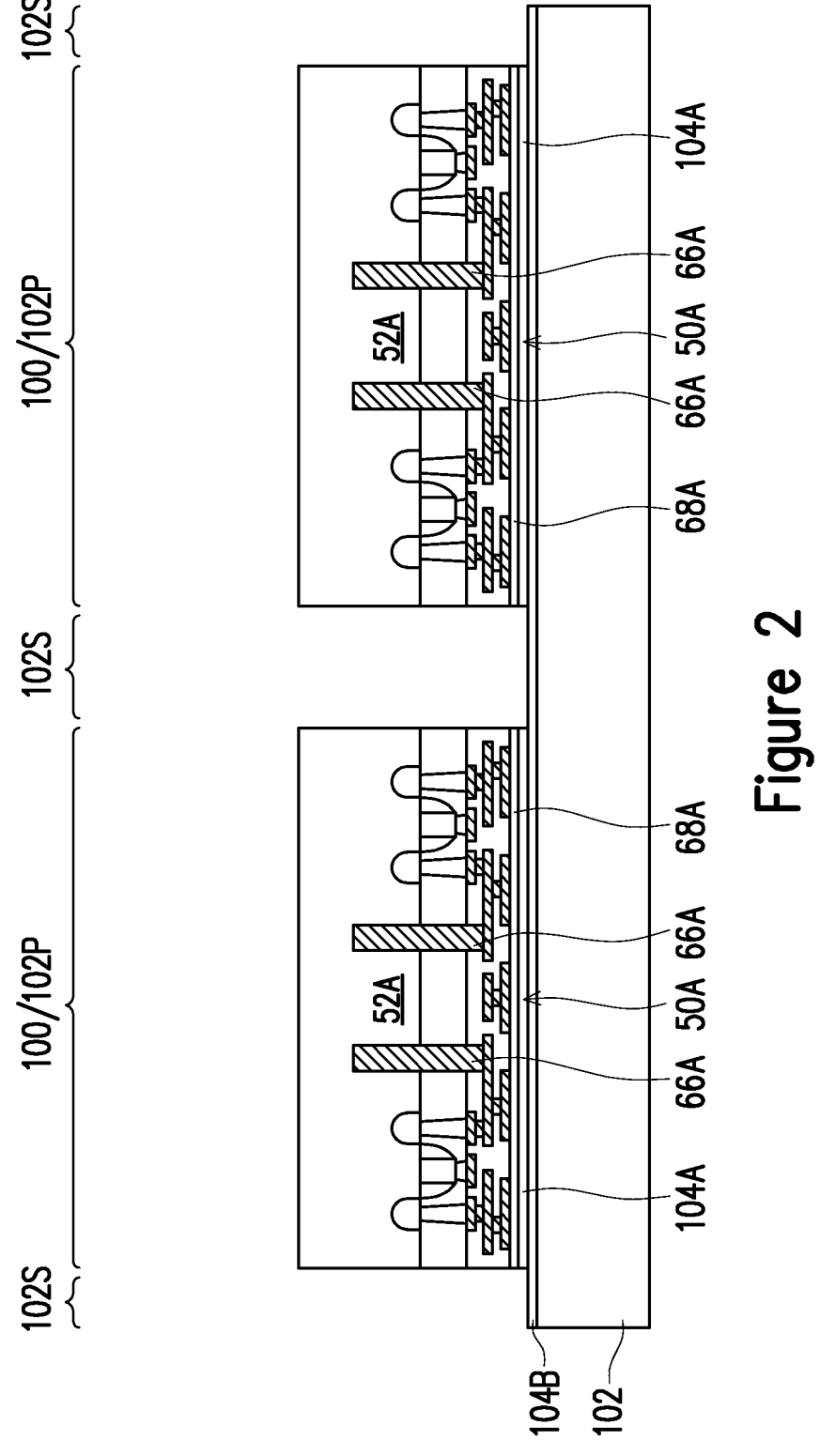
FIGS. 2-22 are cross-sectional views of intermediate stages in the manufacturing of integrated circuit packages, in accordance with some embodiments.

In FIG. 2, a carrier substrate 102 is provided. The carrier substrate 102 may be a glass carrier substrate, a ceramic carrier substrate, or the like. The carrier substrate 102 may be a wafer, such that multiple packages can be formed on the carrier substrate 102 simultaneously.

First integrated circuit dies 50 (e.g., integrated circuit dies 50A) are attached to the carrier substrate 102 in a face-down manner, such that the front-sides of the integrated circuit dies 50 are attached to the carrier substrate 102. One integrated circuit die 50A is placed in each package region 102P. The integrated circuit dies 50A may be placed by, e.g., a pick-and-place process. The integrated circuit dies 50A may be logic devices, such as CPUs, GPUs, SoCs, microcontroller, or the like.

The integrated circuit dies 50A may be attached to the carrier substrate 102 by bonding the integrated circuit dies 50A to the carrier substrate 102 with a bonding film 104. The bonding film 104 is on front-sides of the integrated circuit dies 50A and on a surface of the carrier substrate 102. In some embodiments, the bonding film 104 is a release layer, such as an epoxy-based thermal-release material, which loses its adhesive property when heated, such as a light-to-heat-conversion (LTHC) release coating; an ultra-violet (UV) glue, which loses its adhesive property when exposed to UV lights; or the like. In some embodiments, the bonding film 104 is an adhesive, such as a suitable epoxy, die attach film (DAF), or the like. In some embodiments, the bonding film 104 is an oxide layer such as a layer of silicon oxide. The bonding film 104 may include any desired quantity of release layers and/or adhesive films. In some embodiments, the bonding film 104 includes a first bonding film 104A applied to front-sides of the integrated circuit dies 50 and/or a second bonding film 104B applied over the surface of the carrier substrate 102. For example, the first bonding film

104A may be applied to the front-sides of the integrated circuit dies 50 before singulating to separate the integrated circuit dies 50.

As this stage of processing, the integrated circuit dies 50A do not yet include the dielectric layer 72 or the die connectors 74 (previously described for FIG. 1). As such, the upper passivation layers 68A of the respective integrated circuit dies 50A are attached to the carrier substrate 102. Die connectors for the integrated circuit dies 50A will be subsequently formed after other integrated circuit dies are attached to the integrated circuit dies 50A.

Figure 3:
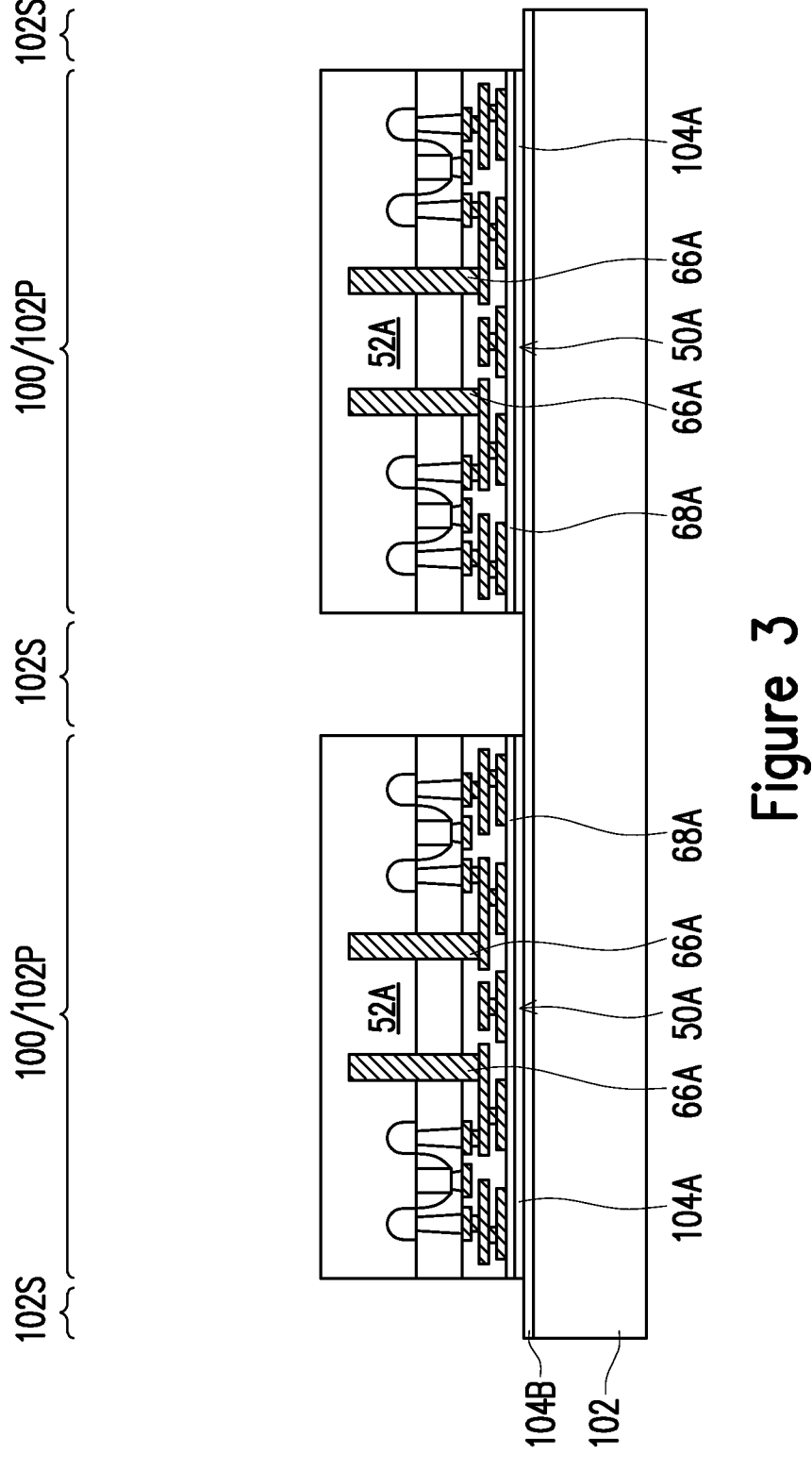

In FIG. 3, the semiconductor substrates 52A of the integrated circuit dies 50A are optionally thinned, which can help reduce the overall thickness of the integrated circuit packages 100. The thinning process may be, for example, a chemical-mechanical polish (CMP), a grinding process, an etch-back process, or the like, which is performed at the back-side of the integrated circuit dies 50A. The thinning process reduces the thickness of the semiconductor substrate 52A. The conductive vias 66A of the integrated circuit dies 50A remain buried by the respective semiconductor substrates 52A after this step of thinning. Thinning the semiconductor substrates 52A at this step of processing can help reduce the costs of exposing the conductive vias 66A in subsequent processing steps.

Figure 4:
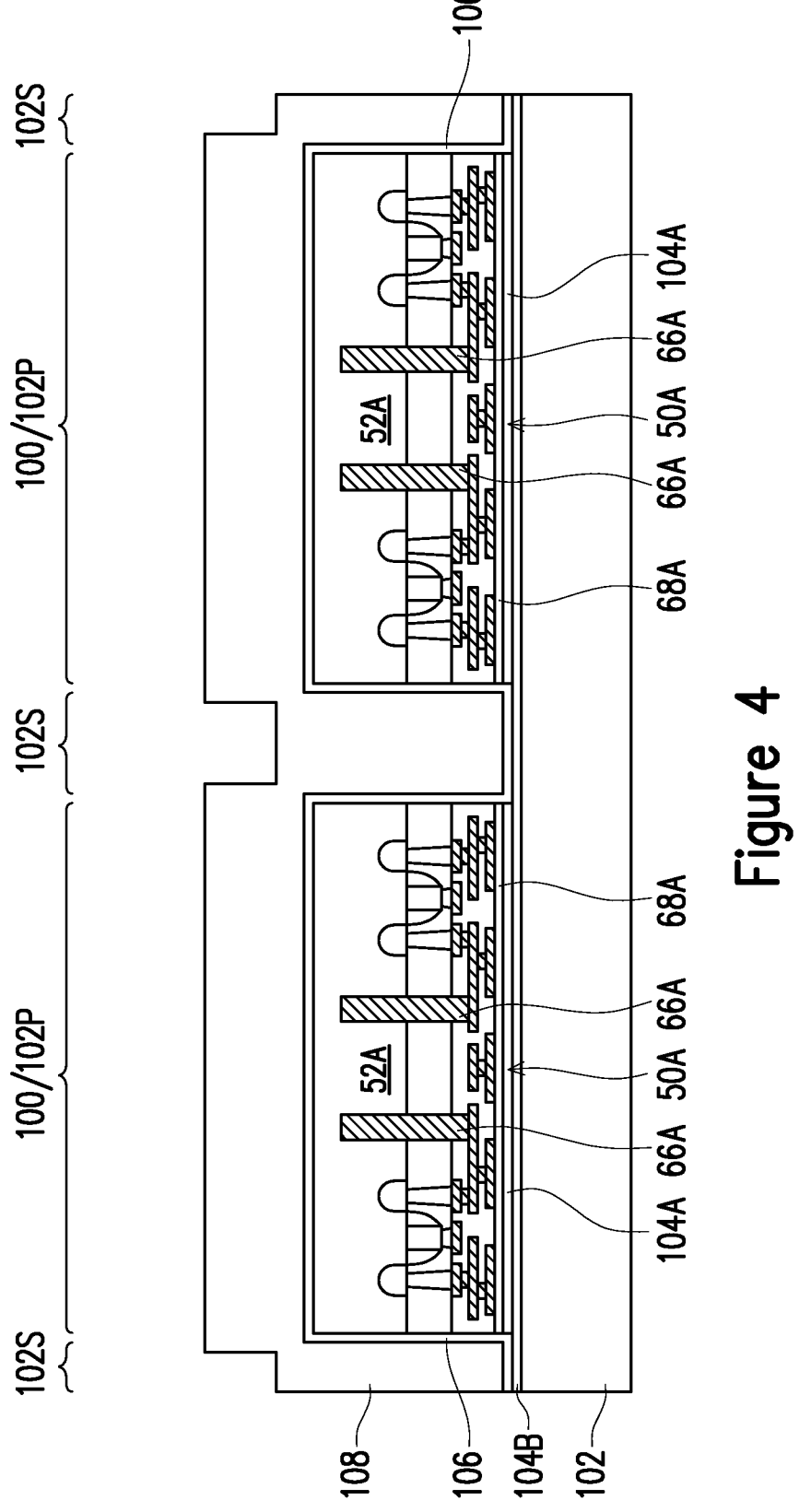

In FIG. 4, a gap-filling dielectric 108 is formed between the integrated circuit dies 50A. Initially, the gap-filling dielectric 108 may bury or cover the integrated circuit dies 50A, such that the top surface of the gap-filling dielectric 108 is above the top surfaces of the integrated circuit dies 50A. The gap-filling dielectric 108 is disposed over the portions of the carrier substrate 102 between the integrated circuit dies 50A, and contacts the top surface of the bonding film 104B (if present) or the carrier substrate 102. The gap-filling dielectric 108 fills (and may overfill) the gaps between the integrated circuit dies 50A. The gap-filling dielectric 108 may be formed of a dielectric material, such as an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like.

In some embodiments, a liner 106 is formed between the gap-filling dielectric 108 and the integrated circuit dies 50A, the bonding film 104B (if present), and the carrier substrate 102. The liner 106 may be formed of a dielectric material having a high etching selectivity from the etching of the gap-filling dielectric 108. Acceptable dielectric materials may include nitrides such as silicon nitride, silicon carbonitride, silicon oxynitride, silicon oxycarbonitride, or the like, which may be formed by a suitable deposition process such as chemical vapor deposition (CVD), atomic layer deposition (ALD), or the like. The liner 106 is formed around the integrated circuit dies 50A, and the gap-filling dielectric 108 is formed on the liner 106.

Portions of the liner 106 and the gap-filling dielectric 108 are disposed in the scribe line regions 102S. As will be subsequently described in greater detail, a chemical removal process will be performed along the scribe line regions 102S. The chemical removal process separates the liner 106 and the gap-filling dielectric 108 in the package regions 102P by removing the portions of the liner 106 and the gap-filling dielectric 108 in the scribe line regions 102S.

Figure 5:
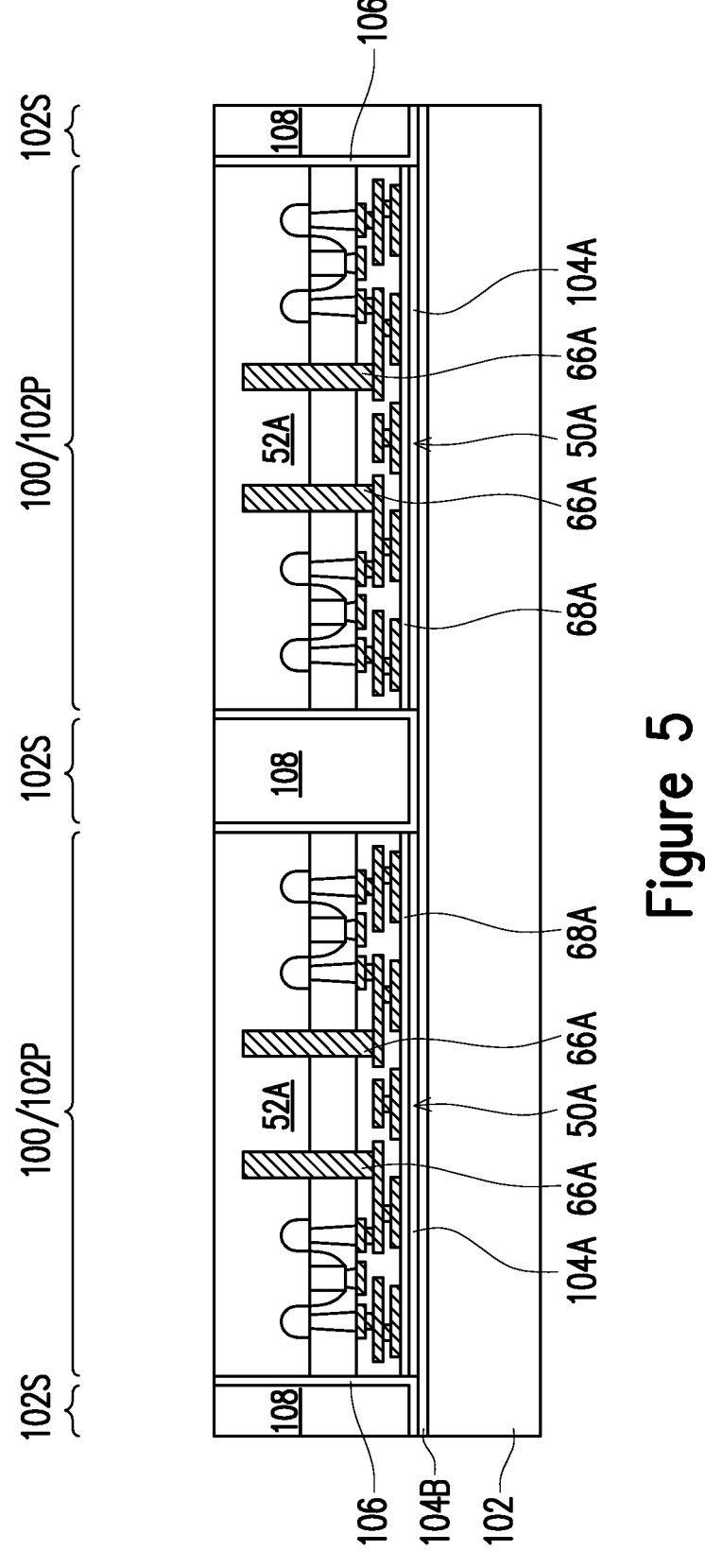

In FIG. 5, a removal process is performed to level surfaces of the gap-filling dielectric 108 with the back-side surfaces of the integrated circuit dies 50A. In some embodiments, a planarization process such as a chemical mechanical polish (CMP), an etch-back process, combinations thereof, or the like is utilized. After the planarization process, surfaces of the gap-filling dielectric 108, the liner 106, and the integrated circuit dies 50A (including the semiconductor substrates 52A) are substantially coplanar (within process variations). The conductive vias 66A may remain buried by the semiconductor substrates 52A after the removal process.

Figure 6:
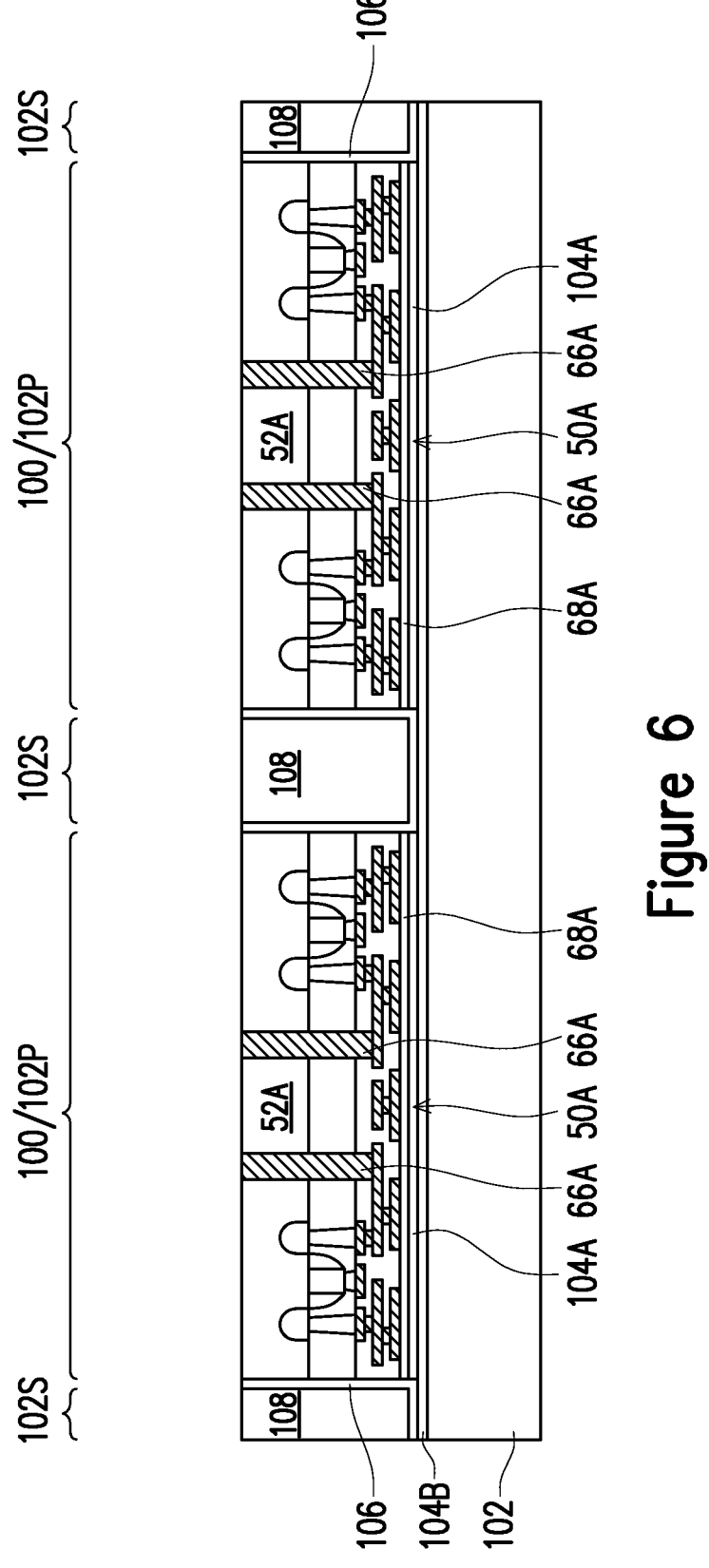

In FIG. 6, the semiconductor substrates 52A are thinned to expose the conductive vias 66A. Portions of the gap-filling dielectric 108 and portions of the liner 106 may also be removed by the thinning process. The thinning process may be, for example, a chemical-mechanical polish (CMP), a grinding process, an etch-back process, or the like, which is performed at the back-side of the integrated circuit dies 50A. In some embodiments, the thinning process utilized to expose the conductive vias 66A is performed at a slower removal rate than the thinning process previously utilized to thin the semiconductor substrates 52A (described for FIG. 3). For example, when the thinning processes are grinding processes, a grinding head utilized to expose the conductive vias 66A may have lesser surface roughness than a grinding head previously utilized to thin the semiconductor substrates 52A. Exposing the conductive vias 66A at a slow removal rate can help avoid overgrinding that may damage the conductive vias 66A.

Figure 7:
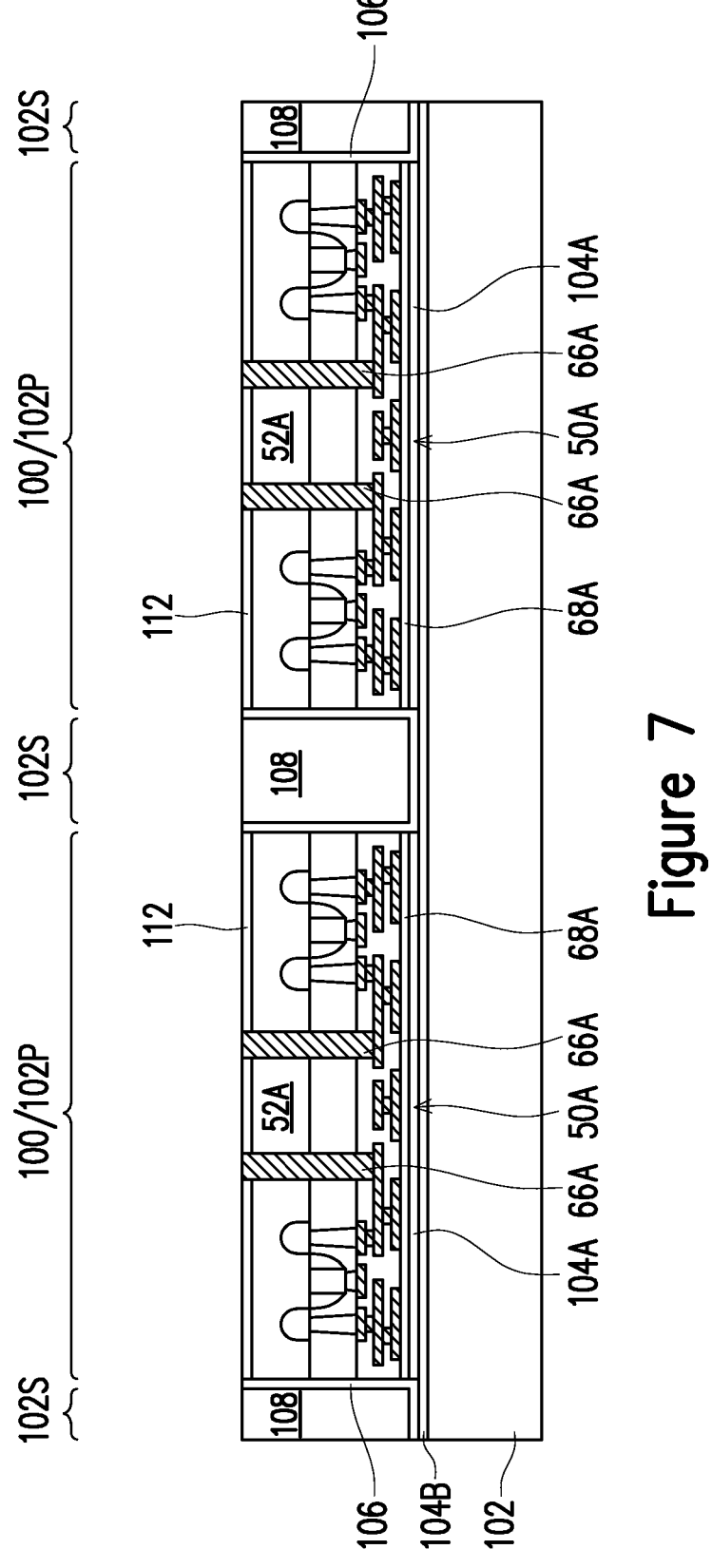

In FIG. 7, a bonding layer 112 is optionally formed around the conductive vias 66A of each integrated circuit die 50A. The bonding layers 112 can help electrically isolate the conductive vias 66A from one another, thus avoiding shorting, and can also be utilized in a subsequent bonding process. As an example to form the bonding layers 112, the semiconductor substrates 52A can be recessed to expose portions of the sidewalls of the conductive vias 66A. The recessing may be by an etching process, such as a dry etch, a wet etch, or combinations thereof. A dielectric material can then be formed in the recesses. The dielectric material can be an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. Other suitable dielectric, such as a low temperature polyimide material, PBO, an encapsulant, combinations of these, or the like may also be utilized. A planarization process, such as a CMP, grinding, or etch-back, can be performed to remove excess portions of the dielectric material over the conductive vias 66A. The remaining portions of the dielectric material in the recesses form the bonding layers 112. The bonding layers 112 laterally surround portions of the sidewalls of the respective conductive vias 66A.

Figure 8:
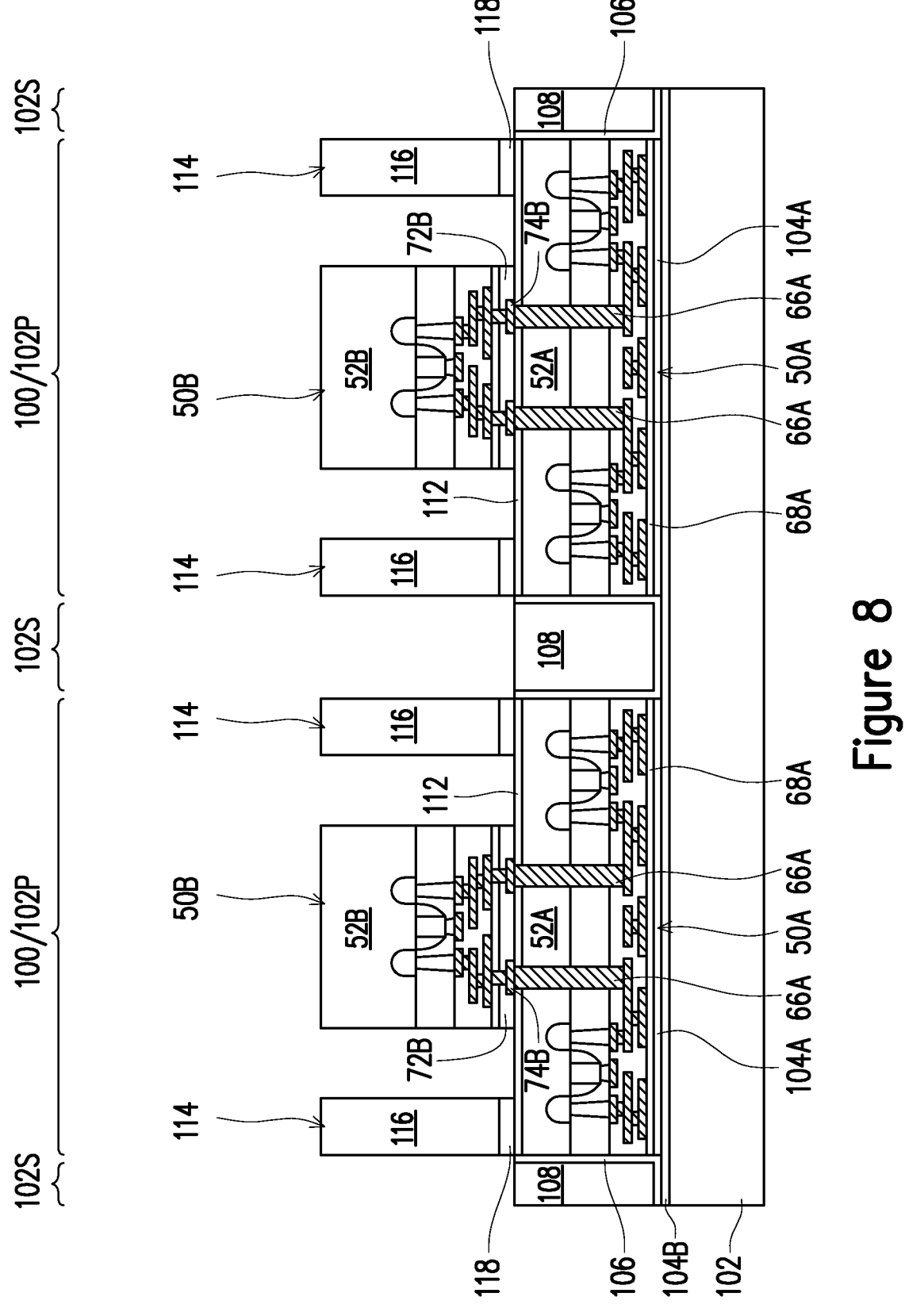

In FIG. 8, second integrated circuit dies 50 (e.g., integrated circuit dies 50B) are attached to the integrated circuit dies 50A in a face-to-back manner, such that the front-sides of the integrated circuit dies 50B are attached to the back-sides of the integrated circuit dies 50A. In the illustrated embodiment, one integrated circuit die 50B is placed in each package region 102P, although any desired quantity of integrated circuit dies 50B may be attached to each integrated circuit die 50A. The integrated circuit dies 50B may be placed by, e.g., a pick-and-place process. The integrated circuit dies 50B may be memory devices, such as dynamic random access memory (DRAM) dies, static random access memory (SRAM) dies, hybrid memory cube (HMC) modules, high bandwidth memory (HBM) modules, or the like.

The integrated circuit dies 50B may be attached to the integrated circuit dies 50A by bonding the integrated circuit dies 50B to the integrated circuit dies 50A. As an example, the integrated circuit dies 50B may be bonded to the integrated circuit dies 50A by hybrid bonding. The dielectric layers 72B of the integrated circuit dies 50B are directly bonded to respective bonding layers 112 of the integrated circuit dies 50A through dielectric-to-dielectric bonding, without using any adhesive material (e.g., die attach film). The die connectors 74B of the integrated circuit dies 50B are directly bonded to respective conductive vias 66A of the integrated circuit dies 50A through metal-to-metal bonding, without using any eutectic material (e.g., solder). The bonding may include a pre-bonding and an annealing. During the pre-bonding, a small pressing force is applied to press the integrated circuit dies 50B against the integrated circuit dies 50A. The pre-bonding is performed at a low temperature, such as about room temperature such as a temperature in the range of 15° C. to 30° C., and after the pre-bonding, the dielectric layers 72B are bonded to the bonding layers 112. The bonding strength is then improved in a subsequent annealing step, in which the bonding layers 112, the conductive vias 66A, the dielectric layers 72B, and the die connectors 74B are annealed. After the annealing, direct bonds such as fusion bonds are formed, bonding the bonding layers 112 to the dielectric layers 72B. For example, the bonds can be covalent bonds between the material of the bonding layers 112 and the material of the dielectric layer 72B. The conductive vias 66A are connected to the die connectors 74B with a one-to-one correspondence. The conductive vias 66A and the die connectors 74B may be in physical contact after the pre-bonding, or may expand to be brought into physical contact during the annealing. Further, during the annealing, the material of the conductive vias 66A and the die connectors 74B (e.g., copper) intermingles, so that metal-to-metal bonds are also formed. Hence, the resulting bonds between the integrated circuit dies 50A, 50B are hybrid bonds that include both dielectric-to-dielectric bonds and metal-to-metal bonds.

When hybrid bonding is utilized to attach the integrated circuit dies 50B to the integrated circuit dies 50A, the integrated circuit packages 100 may be formed without some components. For example, utilizing hybrid bonding allows bonding pads to be omitted from the back-sides of the integrated circuit dies 50A. Instead, the conductive vias 66A are directly connected to the die connectors 74B, with no bonding pads interposed between the conductive vias 66A and the die connectors 74B.

In this embodiment, the integrated circuit dies 50B do not include conductive vias 66 (previously described for FIG. 1). As a result, in this embodiment, the integrated circuit packages 100 each include two layers of integrated circuit dies 50, and the conductive vias 66 are excluded from the integrated circuit dies 50B because the integrated circuit dies 50B are the upper layer of integrated circuit dies 50 in the integrated circuit packages 100. In other embodiments (subsequently described for FIGS. 25-27), the integrated circuit packages 100 each include more than two layers of integrated circuit dies 50, such as three layers of integrated circuit dies 50, and the conductive vias 66 may be formed in other layer of integrated circuit dies 50 besides the upper layer of integrated circuit dies 50.

Optionally, dummy semiconductor features 114 are attached to the integrated circuit dies 50A. Any desired quantity of dummy semiconductor features 114 may be attached to each integrated circuit die 50A. The dummy semiconductor features 114 may be placed by, e.g., a pickand-place process. In some embodiments, the dummy semiconductor features 114 are placed around the integrated circuit dies 50B in each package region 102P. The outer sidewalls of the dummy semiconductor features 114 may be aligned with the sidewalls of the respective integrated circuit die 50A in each package region 102P. The integrated circuit dies 50A may be wider than the integrated circuit dies 50B, and so including the dummy semiconductor features 114 can help reduce the size of gaps between the integrated circuit dies 50B, thereby improving structural reliability of the integrated circuit packages 100.

The dummy semiconductor features 114 may each include a semiconductor substrate 116 and a dielectric layer 118. The semiconductor substrate 116 may be undoped, and may not include devices. The dielectric layers 118 may be formed of a similar material as the dielectric layers 72B. The dummy semiconductor features 114 may be attached to the integrated circuit dies 50A by bonding the dummy semiconductor features 114 to the integrated circuit dies 50A. For example, The dielectric layers 118 of the dummy semiconductor features 114 may be directly bonded to respective bonding layers 112 of the integrated circuit dies 50A through dielectric-to-dielectric bonding, without using any adhesive material (e.g., die attach film). The bonding may include a pre-bonding and an annealing, in a similar manner as the bonding of the integrated circuit dies 50B to the integrated circuit dies 50A. In some embodiments, the dummy semiconductor features 114 and the integrated circuit dies 50B are bonded to the integrated circuit dies 50A by the same bonding process.

Figure 9:
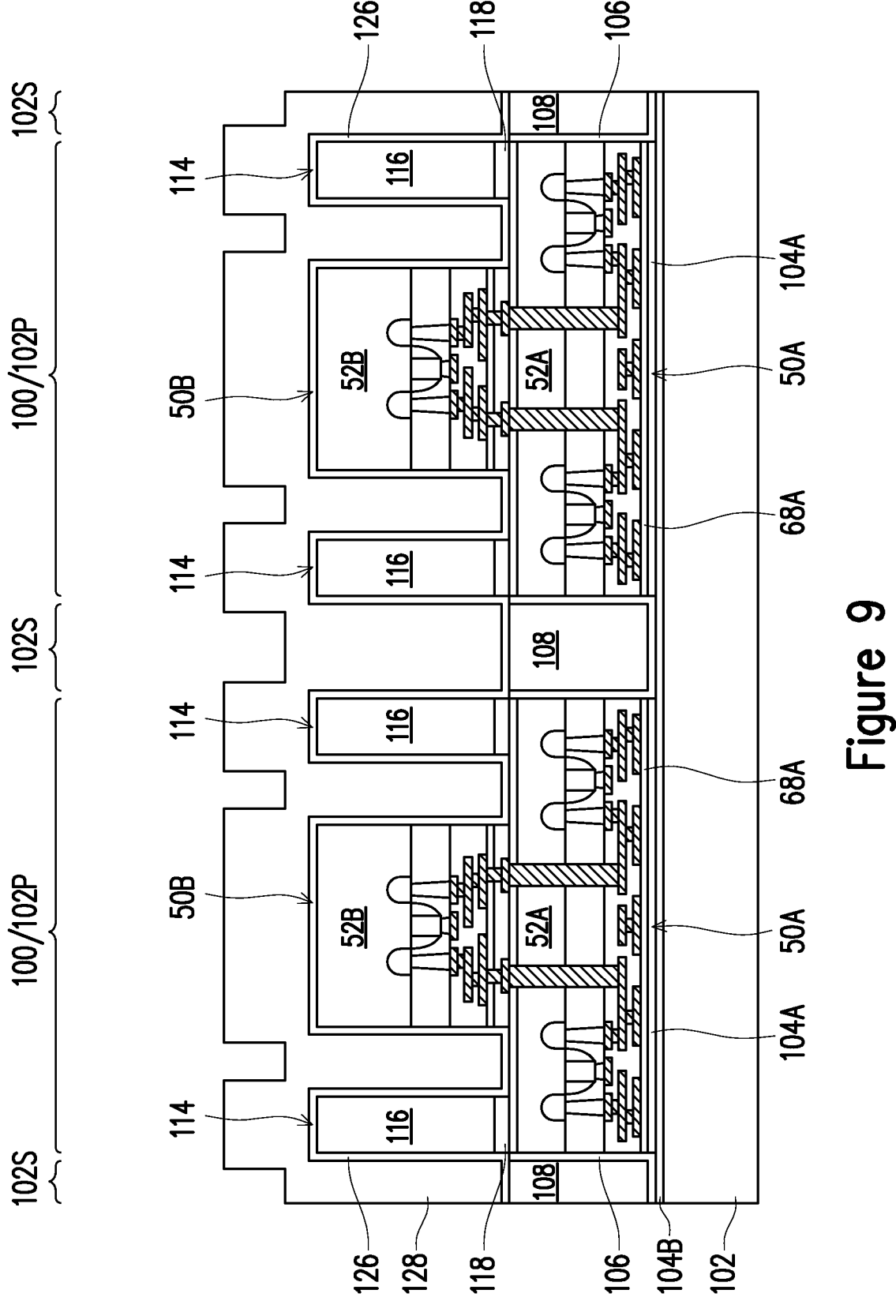

In FIG. 9, a gap-filling dielectric 128 is formed between the dummy semiconductor features 114 (if present) and the integrated circuit dies 50B. Initially, the gap-filling dielectric 128 may bury or cover the dummy semiconductor features 114 and the integrated circuit dies 50B, such that the top surface of the gap-filling dielectric 128 is above the top surfaces of the dummy semiconductor features 114 and the integrated circuit dies 50B. The gap-filling dielectric 128 is disposed over the portions of the gap-filling dielectric 108 between the integrated circuit dies 50A. The gap-filling dielectric 128 fills (and may overfill) the gaps between the dummy semiconductor features 114 and the integrated circuit dies 50B. The gap-filling dielectric 128 may be formed of a dielectric material, such as an oxide such as silicon oxide, phosphosilicate glass (PSG), borosilicate glass (BSG), boron-doped phosphosilicate glass (BPSG), a tetraethyl orthosilicate (TEOS) based oxide, or the like, which may be formed by a suitable deposition process such as chemical vapor deposition (CVD), atomic layer deposition (ALD), or the like. In some embodiments, the gap-filling dielectric 128 is formed of the same dielectric material as the gap-filling dielectric 108.

In some embodiments, a liner 126 is formed between the gap-filling dielectric 128 and the dummy semiconductor features 114, the gap-filling dielectric 108, and the integrated circuit dies 50B. The liner 126 may be formed of a dielectric material having a high etching selectivity from the etching of the gap-filling dielectric 128. Acceptable dielectric materials may include nitrides such as silicon nitride, silicon carbonitride, silicon oxynitride, silicon oxycarbonitride, or the like, which may be formed by a suitable deposition process such as chemical vapor deposition (CVD), atomic layer deposition (ALD), or the like. In some embodiments, the liner 126 is formed of the same dielectric material as the liner 106. The liner 126 is formed around the dummy semiconductor features 114 and the integrated circuit dies 50B, and the gap-filling dielectric 128 is formed on the liner 126.

Portions of the liner 126 and the gap-filling dielectric 128 are disposed in the scribe line regions 102S. As will be subsequently described in greater detail, a chemical removal process will be performed along the scribe line regions 102S. The chemical removal process separates the liner 126 and the gap-filling dielectric 128 in the package regions 102P by removing the portions of the liner 126 and the gap-filling dielectric 128 in the scribe line regions 102S.

Figure 10:
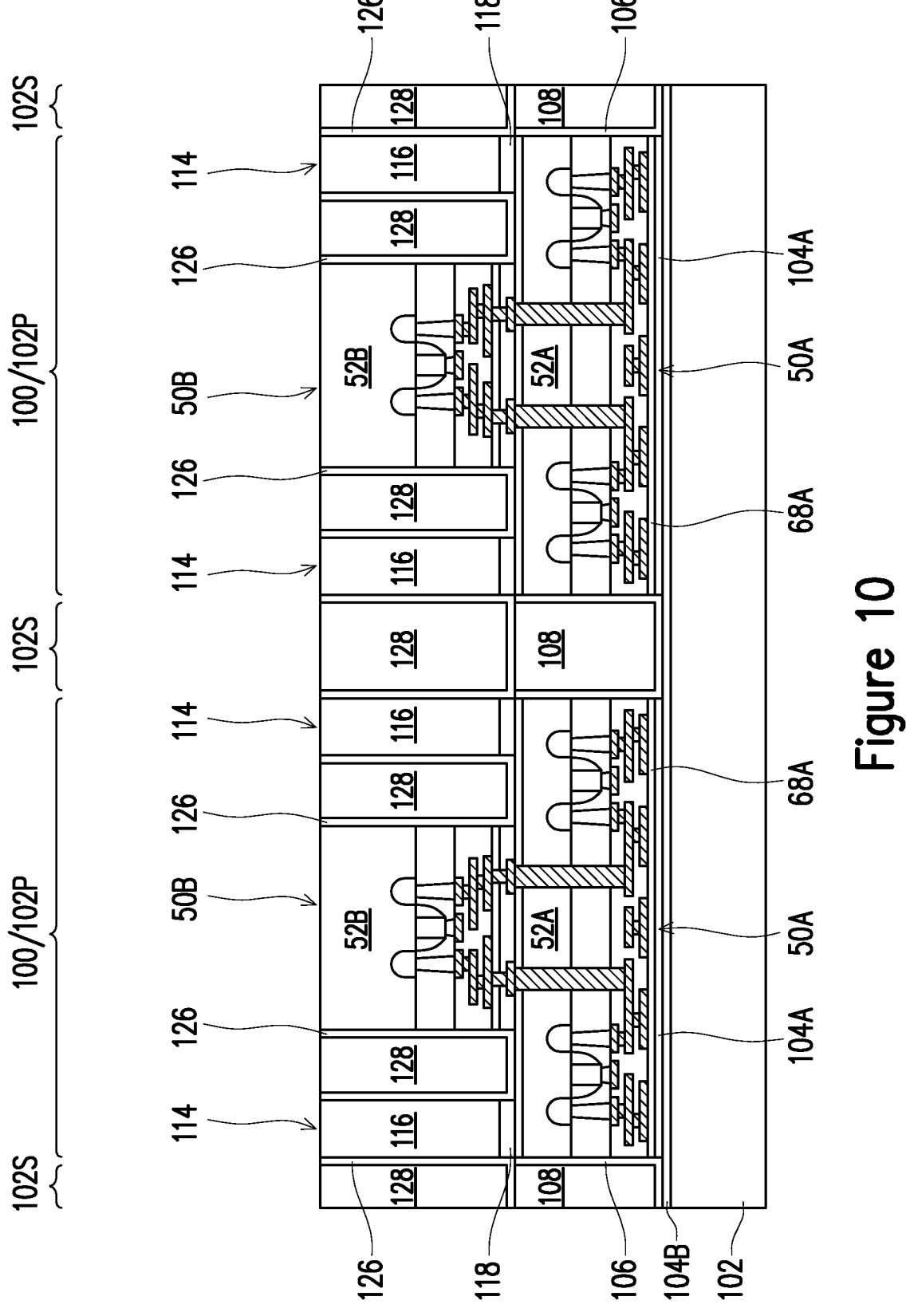

In FIG. 10, a removal process is performed to level surfaces of the gap-filling dielectric 128 with the back-side surfaces of the dummy semiconductor features 114 and the integrated circuit dies 50B. In some embodiments, a planarization process such as a chemical mechanical polish (CMP), an etch-back process, combinations thereof, or the like is utilized. After the planarization process, surfaces of the gap-filling dielectric 128, the liner 126, the dummy semiconductor features 114, and the integrated circuit dies 50B (including the semiconductor substrates 52B) are substantially coplanar (within process variations).

The liner 106 extends along the sidewall of the integrated circuit dies 50A, and the liner 126 extends along the sidewall of the dummy semiconductor features 114 and the sidewalls of the integrated circuit dies 50B. In embodiments where the outer sidewalls of the dummy semiconductor features 114 are aligned with the outer sidewalls of the respective integrated circuit dies 50A, the outer sidewalls of the liner 106 are aligned with the outer sidewalls of the liner 126. More generally, the liners 106, 126 each include vertical portions and horizontal portions, with the vertical portions of the liner 106 being aligned with respective vertical portions of the liner 126.

Figure 11:
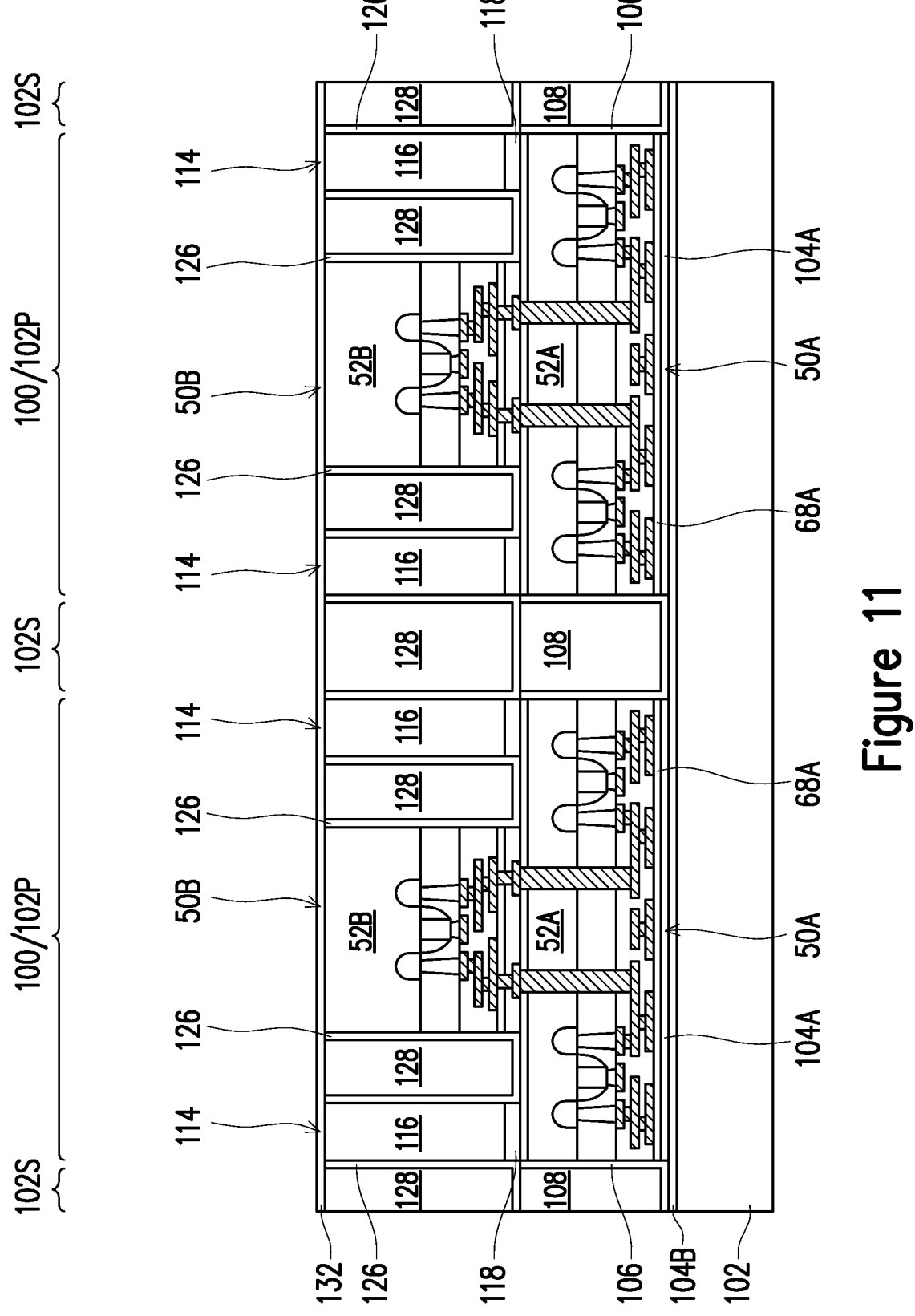

In FIG. 11, a etch stop layer 132 is formed on the planarized surfaces of the gap-filling dielectric 128, the liner 126, the dummy semiconductor features 114, and the integrated circuit dies 50B. The etch stop layer 132 may be formed of a dielectric material having a high etching selectivity from the etching of the gap-filling dielectric 128. Acceptable dielectric materials may include nitrides such as silicon nitride, silicon carbonitride, silicon oxynitride, silicon oxycarbonitride, or the like, which may be formed by a suitable deposition process such as chemical vapor deposition (CVD), atomic layer deposition (ALD), or the like. In some embodiments, the etch stop layer 132 is formed of the same dielectric material as the liners 106, 126.

Figure 12:
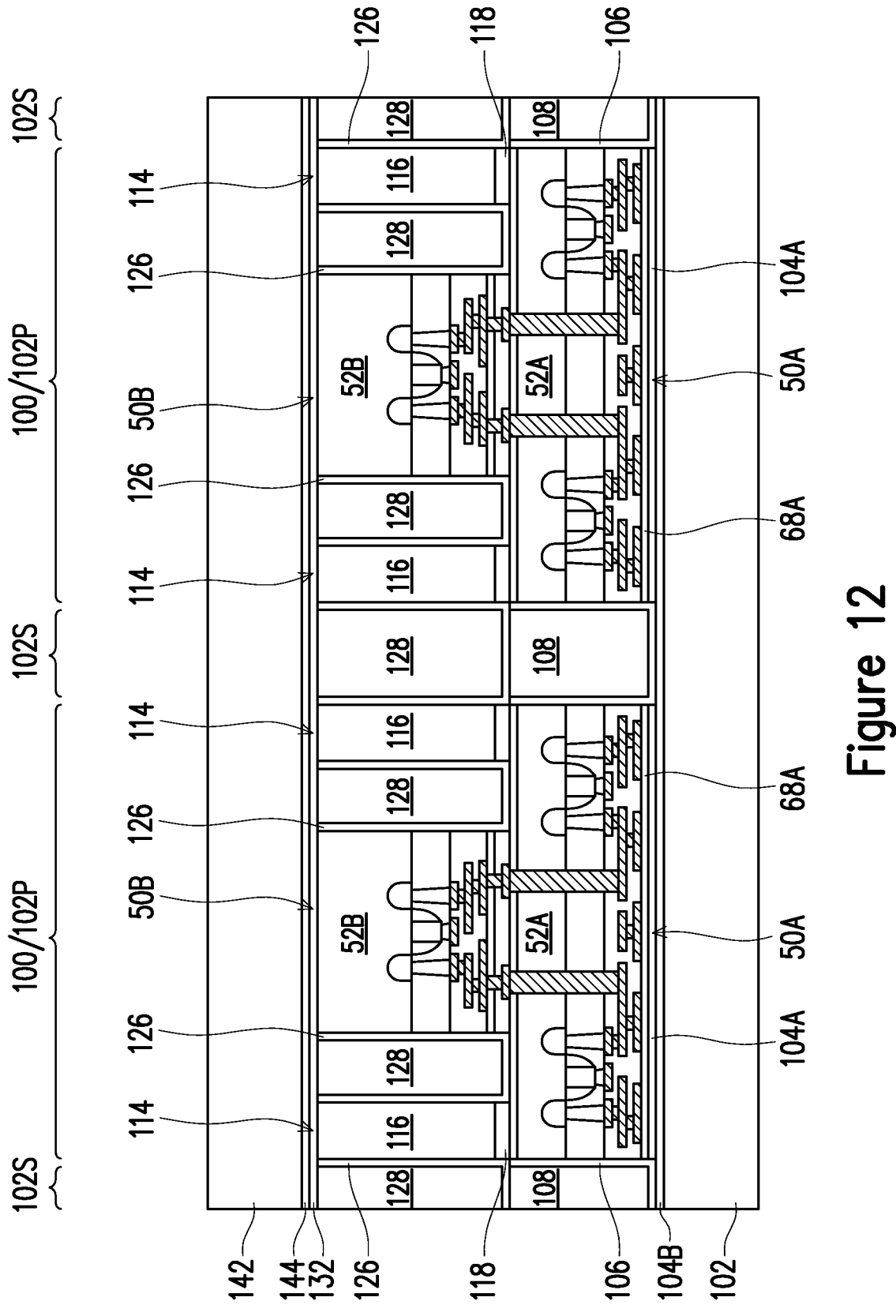

In FIG. 12, a support substrate 142 is attached to the etch stop layer 132. The support substrate 142 may be a glass support substrate, a ceramic support substrate, or the like. The support substrate 142 may be a wafer.

The support substrate 142 may be attached to the etch stop layer 132 by bonding the support substrate 142 to the etch stop layer 132 with a bonding film 144. The bonding film 144 is on a surface of the support substrate 142 and a surface of the etch stop layer 132. In some embodiments, the bonding film 144 is a release layer, such as an epoxy-based thermal-release material, which loses its adhesive property when heated, such as a light-to-heat-conversion (LTHC) release coating; an ultra-violet (UV) glue, which loses its adhesive property when exposed to UV lights; or the like. In some embodiments, the bonding film 144 is an adhesive, such as a suitable epoxy, die attach film (DAF), or the like. In some embodiments, the bonding film 144 is an oxide layer such as a layer of silicon oxide. The bonding film 144 may include any desired quantity of release layers and/or adhesive films. The bonding film 144 may be applied to the support substrate 142 and/or to the etch stop layer 132.

Figure 13:
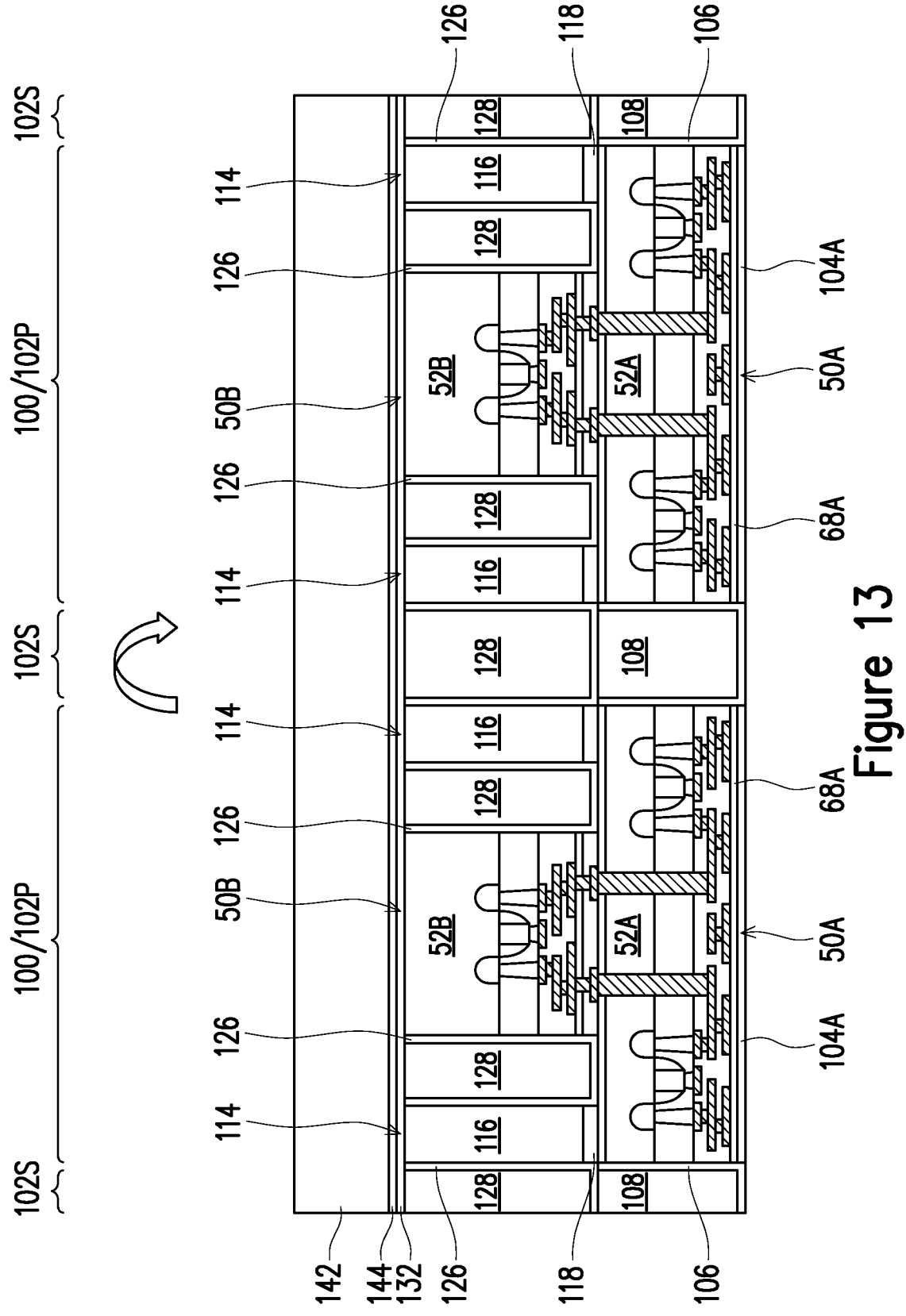

In FIG. 13, a carrier substrate de-bonding is performed to detach (or "de-bond") the carrier substrate 102 from the integrated circuit dies 50A. In accordance with some embodiments where the first bonding film 104A includes a release layer, the de-bonding includes projecting a light such as a laser light or an UV light on the first bonding film 104A so that the first bonding film 104A decomposes under the heat of the light and the carrier substrate 102 can be removed. The structure is then flipped over and placed on a tape (not separately illustrated).

Figure 14:
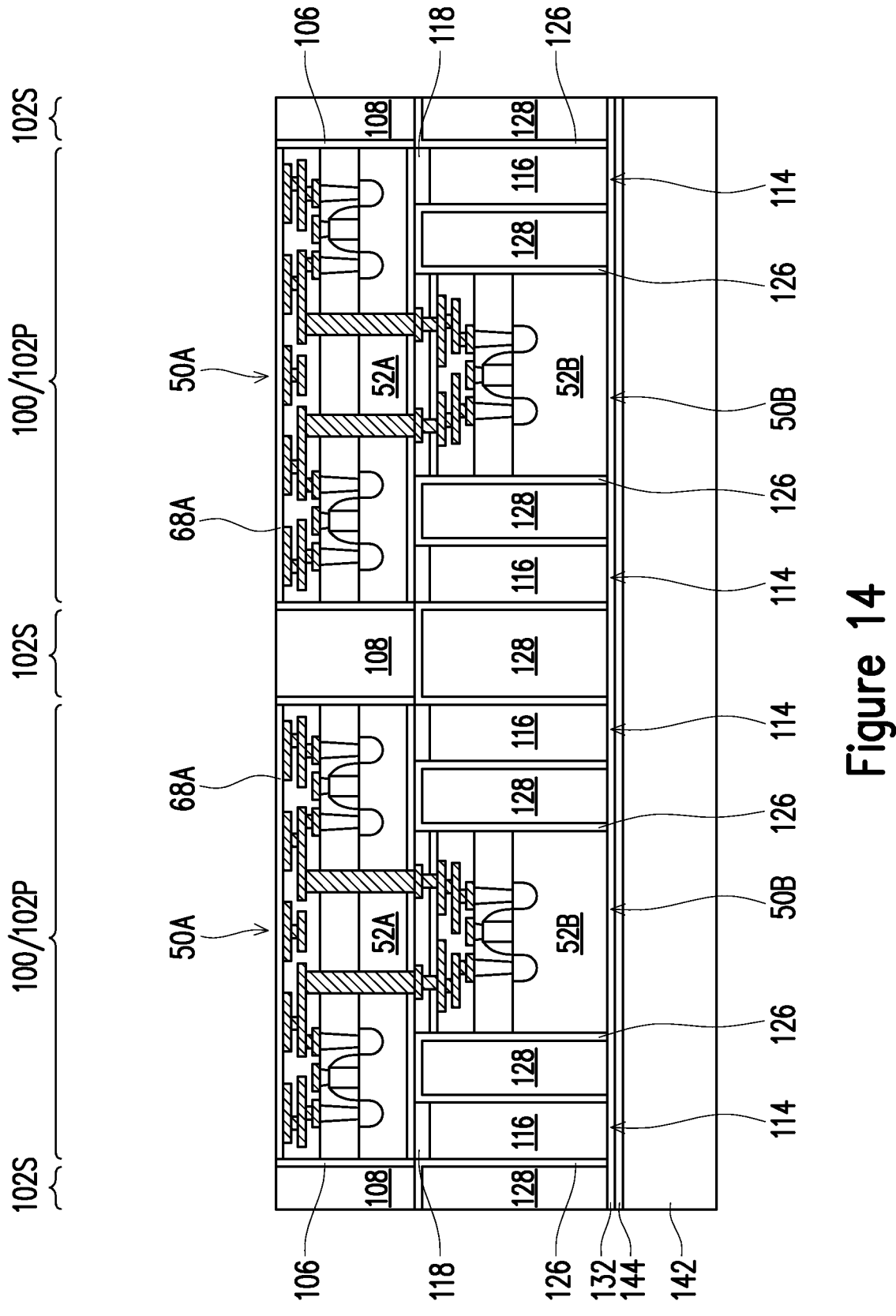

In FIG. 14, a removal process is performed to expose the upper passivation layers 68A of the integrated circuit dies 50A. Portions of the gap-filling dielectric 108 and portions of the liner 106 may also be removed by the removal process such that the gap-filling dielectric 108 is exposed. The removal process may level surfaces of upper passivation layers 68A with surfaces of the gap-filling dielectric 108 and the liner 106. In some embodiments, a planarization process such as a chemical mechanical polish (CMP), an etch-back process, combinations thereof, or the like is utilized. After the planarization process, surfaces of the gap-filling dielectric 108, the liner 106, and the integrated circuit dies 50A (including the upper passivation layers 68A) are substantially coplanar (within process variations).

FIGS. 15-18 are views of a removal process 152 for separating some features in the package regions 102P. The removal process 152 is performed along the scribe line regions 102S, e.g., between the package regions 102P. The removal process 152 includes a chemical process and does not include mechanical processes. Specifically, the chemical process will be performed to remove the liners 106, 126 and the gap-filling dielectrics 108, 128 from the scribe line regions 102S. The chemical process includes a photolithography operation and multiple etching operations. Utilizing a chemical process (instead of a mechanical process) to remove the gap-filling dielectrics 108, 128 from the scribe line regions 102S can reduce the risk of cracks forming in the gap-filling dielectrics 108, 128 during removal. Reliability of the resulting integrated circuit packages 100 during testing or operation may thus be improved. A mechanical process (subsequently described for FIG. 22) will be performed after the chemical process to singulate the etch stop layer 132 and the support substrate 142 along the scribe line regions 102S.

Figure 15:
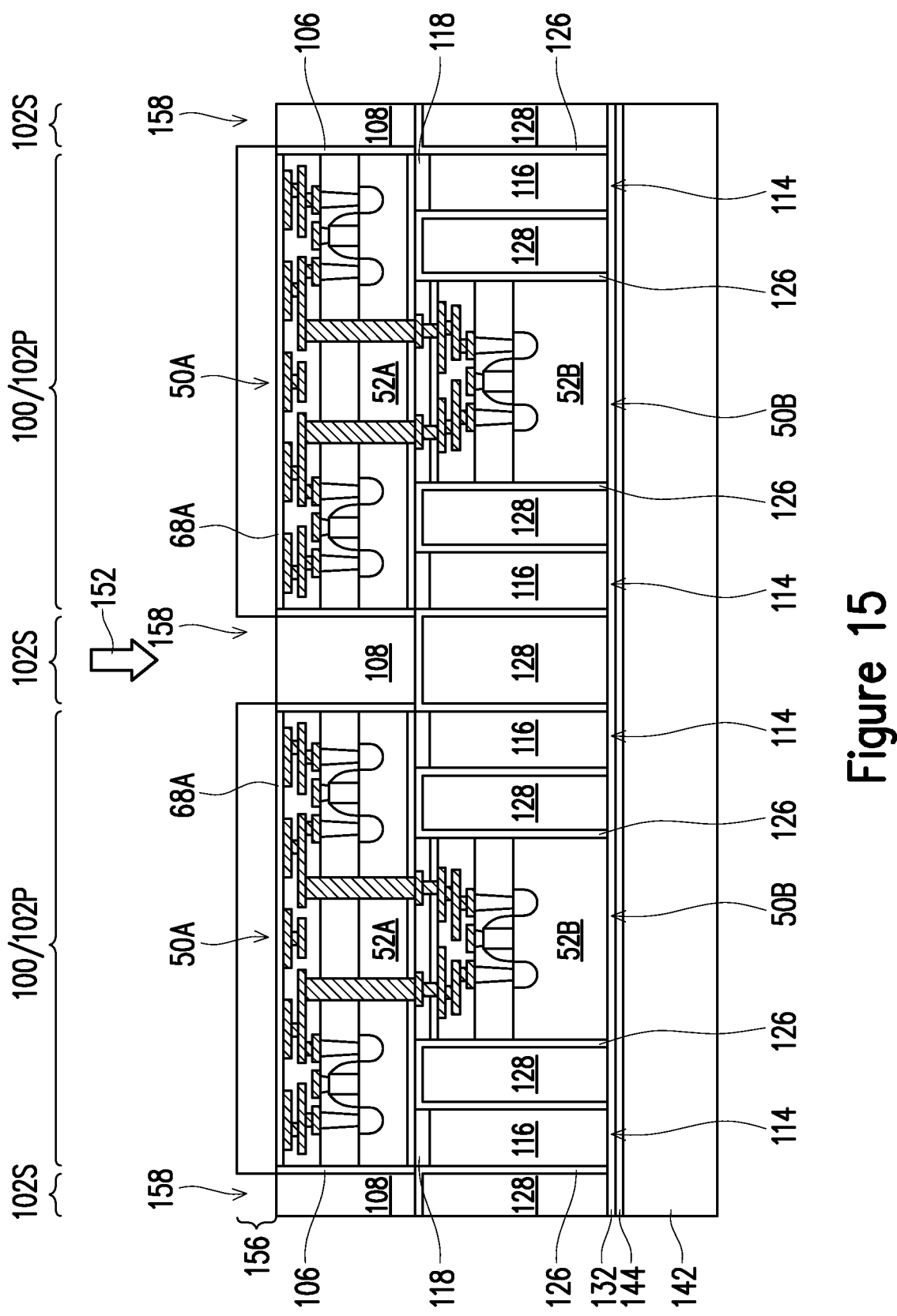

In FIG. 15, a mask 156 is formed over the integrated circuit dies 50A. The mask 156 may also be formed over portions of the gap-filling dielectric 128 and/or the liner 126. The mask 156 covers and protects the integrated circuit dies 50A during subsequent etching processes. The mask 156 may be formed by forming one or more masking layer(s) and then patterning the masking layer(s) with openings 158. The masking layer(s) can be any acceptable photoresist that includes a photosensitive material, such as a single-layer photoresist, a bi-layer photoresist, a tri-layer photoresist, or the like, which may be formed by spin coating, a deposition process such as CVD, combinations thereof, or the like. The masking layer(s) may be patterned with the openings 158 using acceptable photolithography and etching techniques to form the mask 156. The openings 158 are in the scribe line regions 102S, such that the package regions 102P are masked by the mask 156. The width of the openings 158 may be less than or equal to the width of the scribe line regions 102S.

Figure 16:
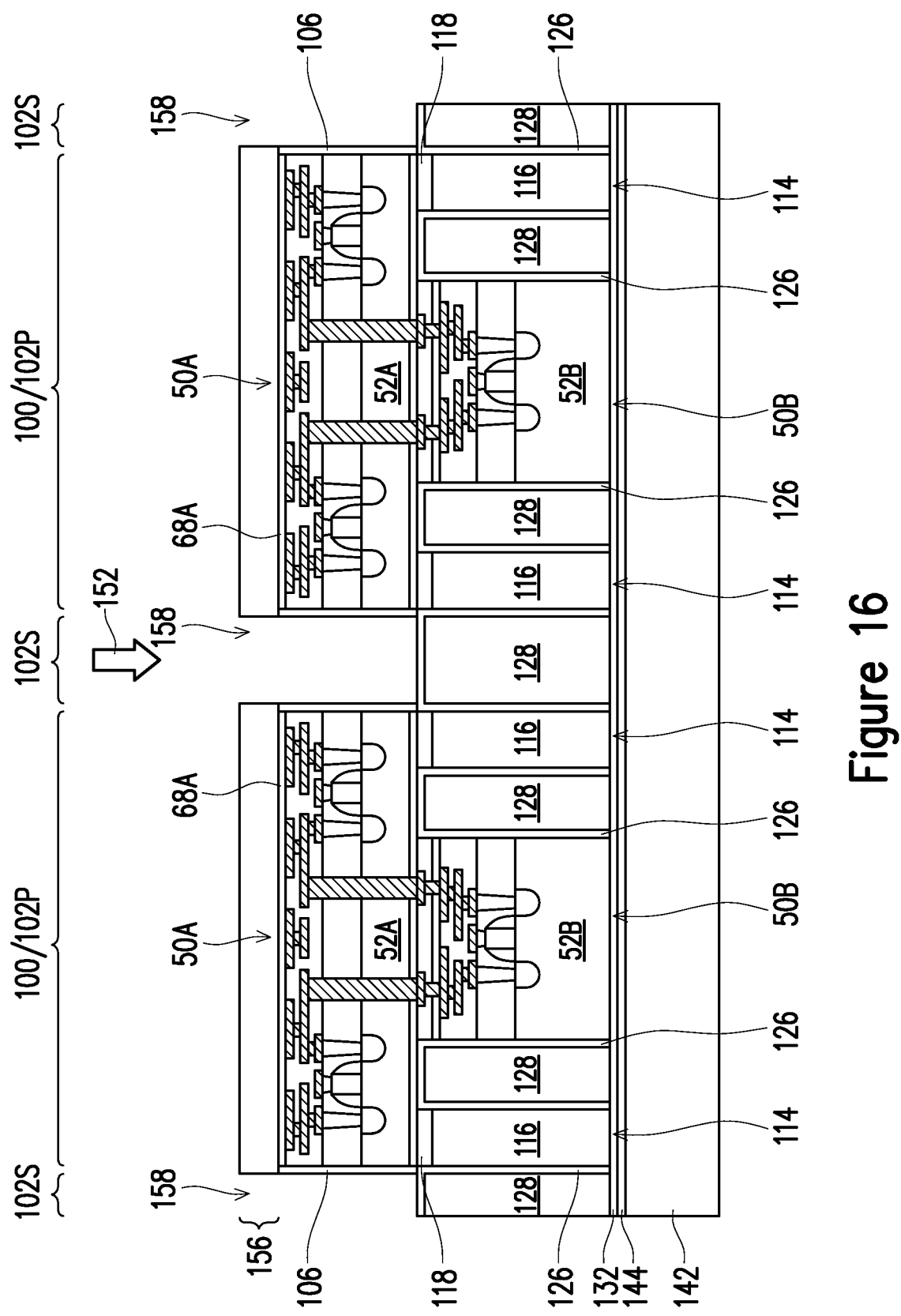

In FIG. 16, the openings 158 are extended through the gap-filling dielectric 108 in the scribe line regions 102S. The openings 158 are extended through the gap-filling dielectric 108 by etching the gap-filling dielectric 108 using the mask 156 as an etching mask. In some embodiments, the gap-filling dielectric 108 is etched by an isotropic etch process. For example, the etching process may include a wet etch process using an etching solution that selectively etches the material of the gap-filling dielectric 108 at a faster rate than the material(s) of the liner 126 and the upper passivation layers 68A. When the gap-filling dielectric 108 is formed of silicon oxide, suitable wet etchants include hydrofluoric (HF) acid or the like. During the removal, the liner 126 may be used as an etch stop layer when the gap-filling dielectric 108 is etched.

Figure 17:
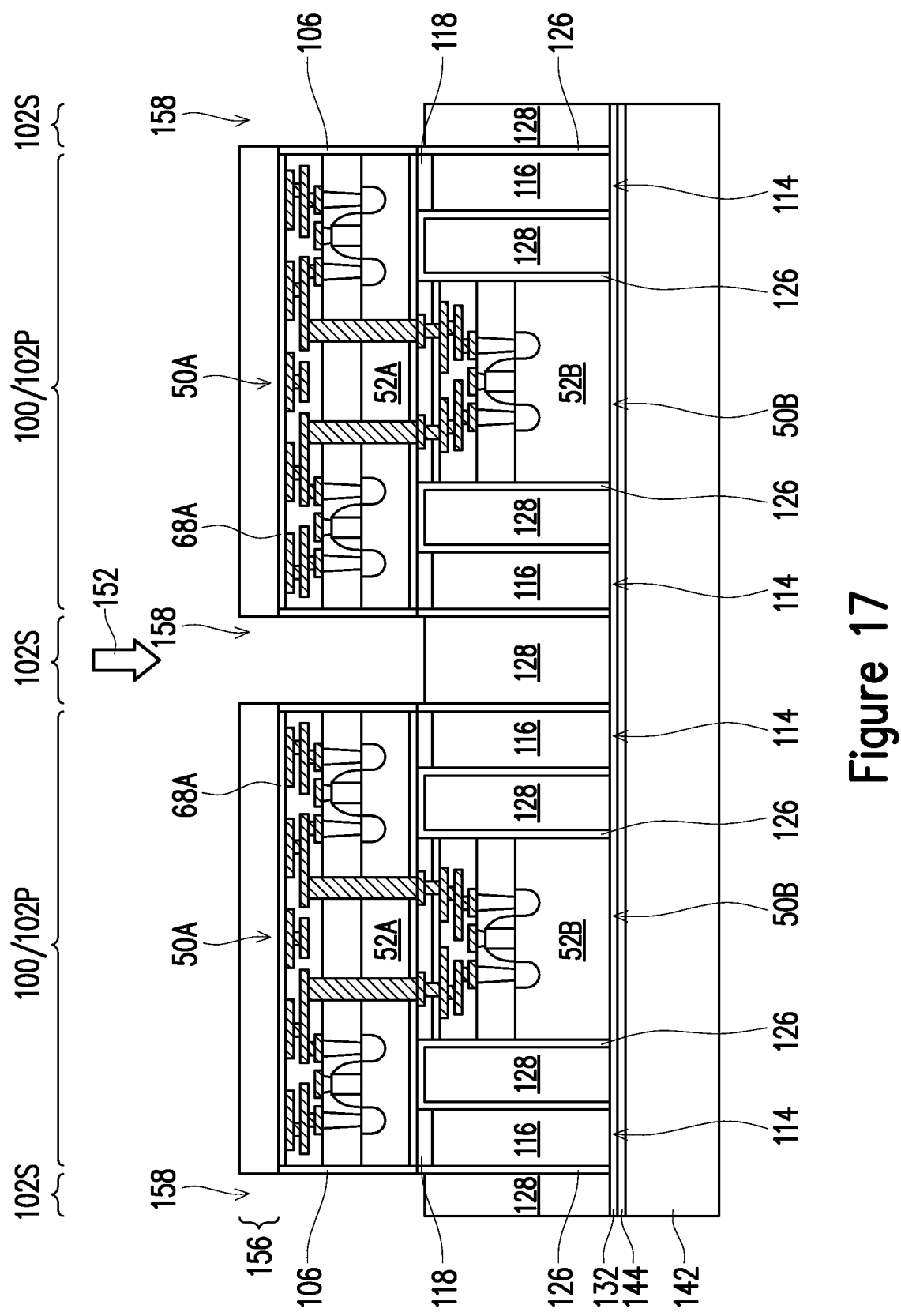

In FIG. 17, the openings 158 are extended through the liner 126 in the scribe line regions 102S. The openings 158 are extended through the liner 126 by etching the liner 126 using the mask 156 as an etching mask. In some embodiments, the liner 126 is etched by an anisotropic etch process. For example, the etching process may include a dry etch process using reaction gas(es) that selectively etch the material of the liner 126 at a faster rate than the material(s) of the gap-filling dielectric 128 and the upper passivation layers 68A. When the liner 126 is formed of silicon nitride, suitable dry etchants include carbon tetrafluoride ($CF_4$) or the like. During the removal, the gap-filling dielectric 128 may be used as an etch stop layer when the liner 126 is etched.

Figure 18:
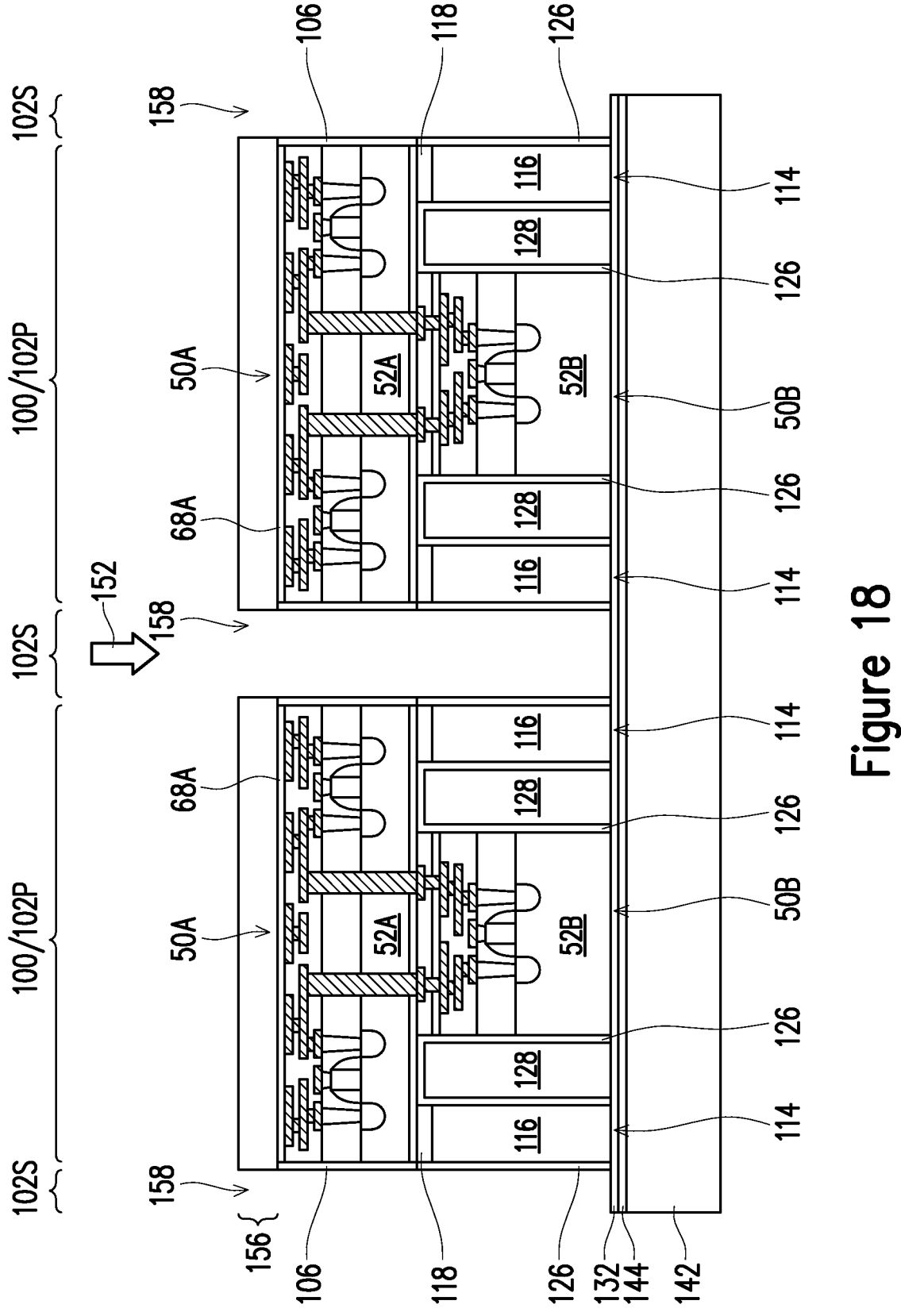

In FIG. 18, the openings 158 are extended through the gap-filling dielectric 128 in the scribe line regions 102S. The openings 158 are extended through the gap-filling dielectric 128 by etching the gap-filling dielectric 128 using the mask 156 as an etching mask. In some embodiments, the gap-filling dielectric 128 is etched by an isotropic etch process. For example, the etching process may include a wet etch process using an etching solution that selectively etches the material of the gap-filling dielectric 128 at a faster rate than the material(s) of the etch stop layer 132 and the upper passivation layers 68A. When the gap-filling dielectric 128 is formed of silicon oxide, suitable wet etchants include hydrofluoric (HF) acid or the like. During the removal, the etch stop layer 132 may be used as an etch stop layer when the gap-filling dielectric 128 is etched. Utilizing the etch stop layer 132 as an etch stop layer may advantageously avoid etching of the bonding film 144, particularly when the gap-filling dielectric 128 and the bonding film 144 are formed of the same material (e.g., an oxide). After the etching processes, the mask 156 may be removed, such as by any acceptable ashing process.

After the removal process 152, the etch stop layer 132 is exposed. The removal process 152 may remove all of the gap-filling dielectric 108 such that no gap-filling dielectric 108 remains in the integrated circuit packages 100. The removal process 152 removes some of the gap-filling dielectric 128, such that portions of the gap-filling dielectric 128 remain between the integrated circuit dies 50B and the dummy semiconductor features 114. The removal process 152 may remove all of the horizontal portions of the liners 106, such that only vertical portions of the liners 106 remain on the sidewalls of the integrated circuit dies 50A. The removal process 152 removes some of the liners 126, such that vertical portions of the liners 126 remain on the sidewalls of the integrated circuit dies 50B and the dummy semiconductor features 114, and horizontal portion of the liners 126 remain between the integrated circuit dies 50B and the dummy semiconductor features 114.

Figure 19:
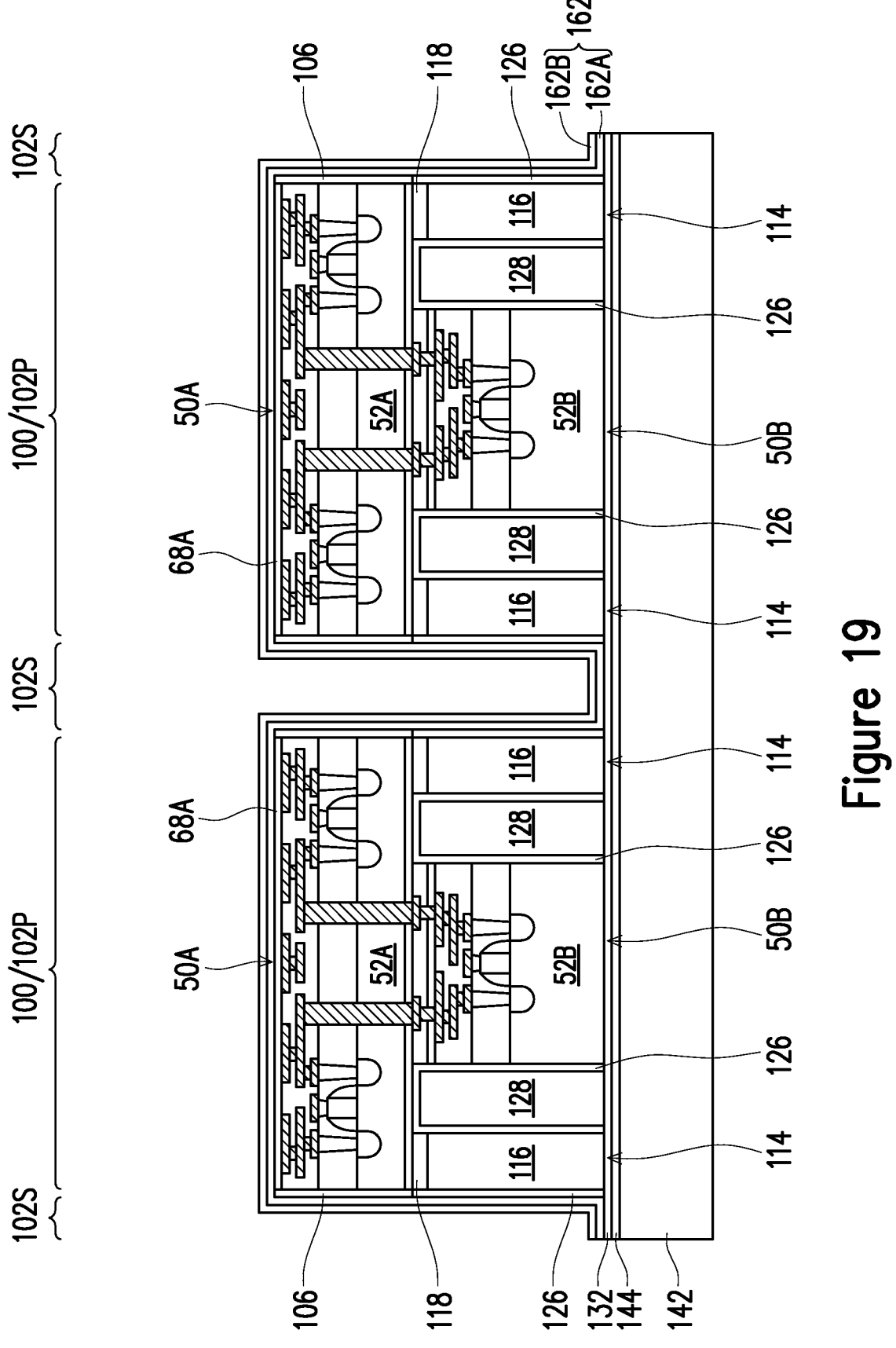

In FIG. 19, one or more passivation layer(s) 162 are formed on the integrated circuit dies 50A, the etch stop layer 132, and the sidewalls of the liners 106, 126. The passivation layer(s) 162 may be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzocyclobutene (BCB) based polymer, molding compound, the like, or a combination thereof. The passivation layer(s) 162 may be formed by chemical vapor deposition (CVD), spin coating, lamination, the like, or a combination thereof. In some embodiments, the passivation layer(s) 162 include a first passivation layer 162A formed of an oxide and a second passivation layer 162B formed of a nitride.

Because the gap-filling dielectrics 108, 128 (see FIG. 15) were removed from the scribe line regions 102S, the passivation layer(s) 162 in this embodiment extend along the outer sidewalls of the dummy semiconductor features 114, the outer sidewalls of the integrated circuit dies 50A, and the top surfaces of the integrated circuit dies 50A. The passivation layer(s) 162 also extend along a top surface of the support substrate 142. The liners 106 are between the passivation layer(s) 162 and the outer sidewalls of the integrated circuit dies 50A. The liners 126 are between the passivation layer(s) 162 and the outer sidewalls of the dummy semiconductor features 114. In other embodiments (subsequently described for FIGS. 23-24), an epoxy material such as a molding compound or underfill is formed in the scribe line regions 102S (e.g., around the various components of the integrated circuit package 100) before the passivation layer(s) 162 are formed, such that the epoxy material extends along the outer sidewalls of the dummy semiconductor features 114 and the outer sidewalls of the integrated circuit dies 50A.

Figure 20:
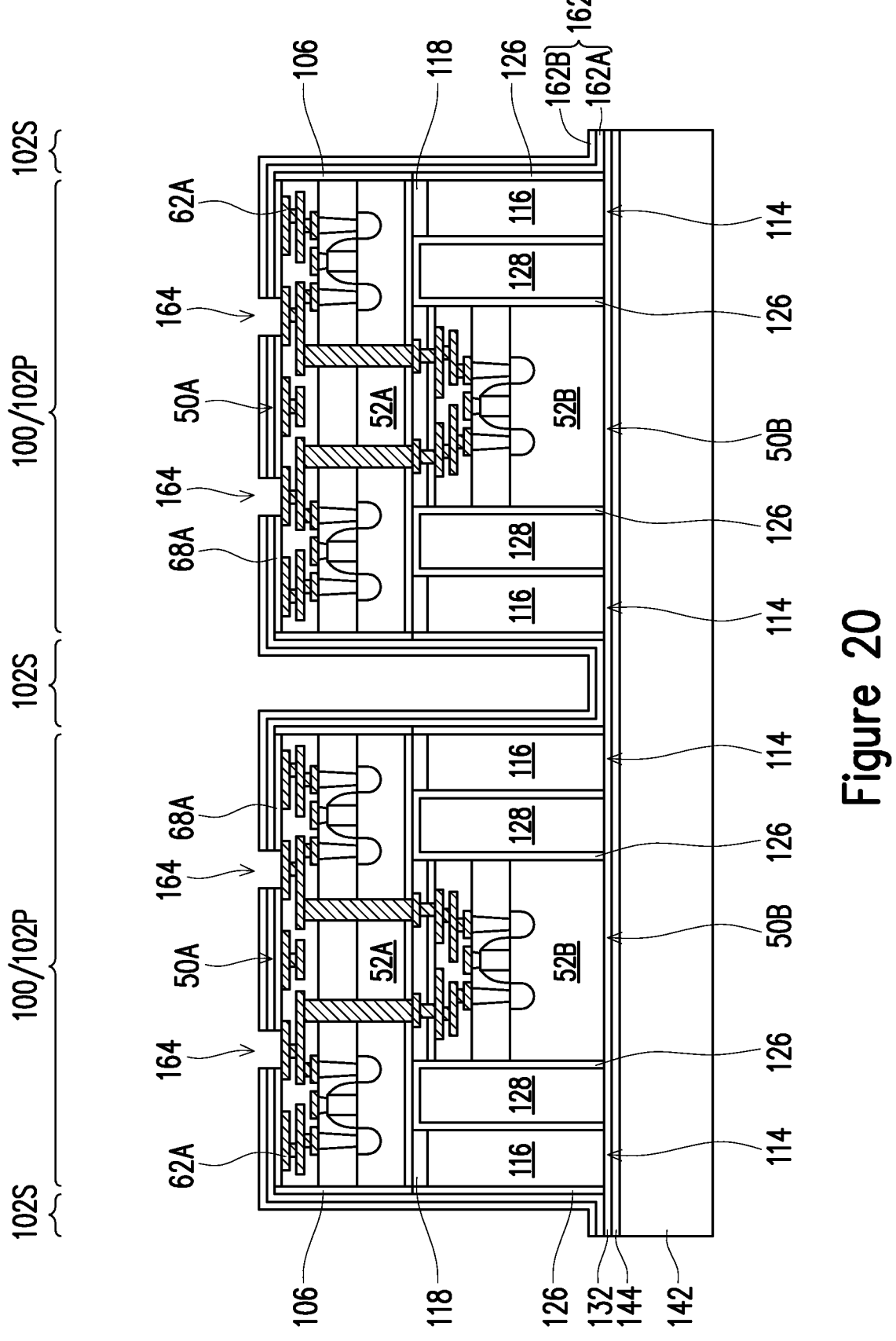

In FIG. 20, openings 164 for die connectors are formed through the passivation layer(s) 162 (if present) and the passivation layer(s) 68. The openings 164 may be formed by suitable photolithography and etching techniques. In some embodiments, the openings 164 expose portions of an upper metallization pattern 62A of the integrated circuit dies 50A.

Figure 21:
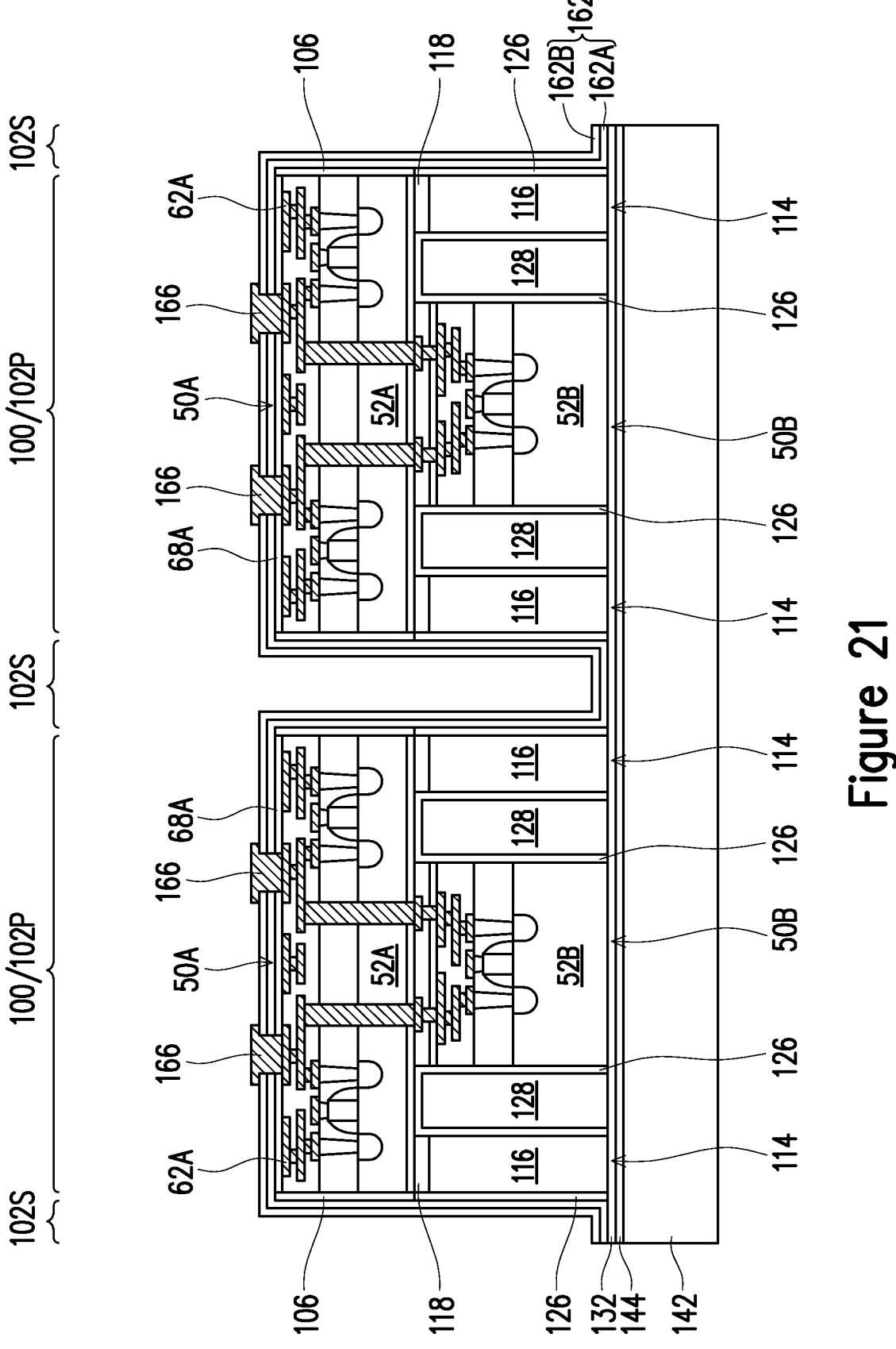

In FIG. 21, die connectors 166 are optionally formed in the openings 164. The die connectors 166 may include conductive pillars, pads, or the like, to which external connections can be made. In some embodiments, the die connectors 166 include bond pads at the front-side surface of the integrated circuit die 50A, and include bond pad vias that connect the bond pads to the upper metallization pattern 62A of the integrated circuit die 50A. In such embodiments, the die connectors 166 (including the bond pads and the bond pad vias) may be formed by a damascene process, such as a single damascene process, a dual damascene process, or the like. The die connectors 166 can be formed of a conductive material, such as a metal, such as copper, aluminum, or the like, which can be formed by, for example, plating, or the like.

Figure 22:
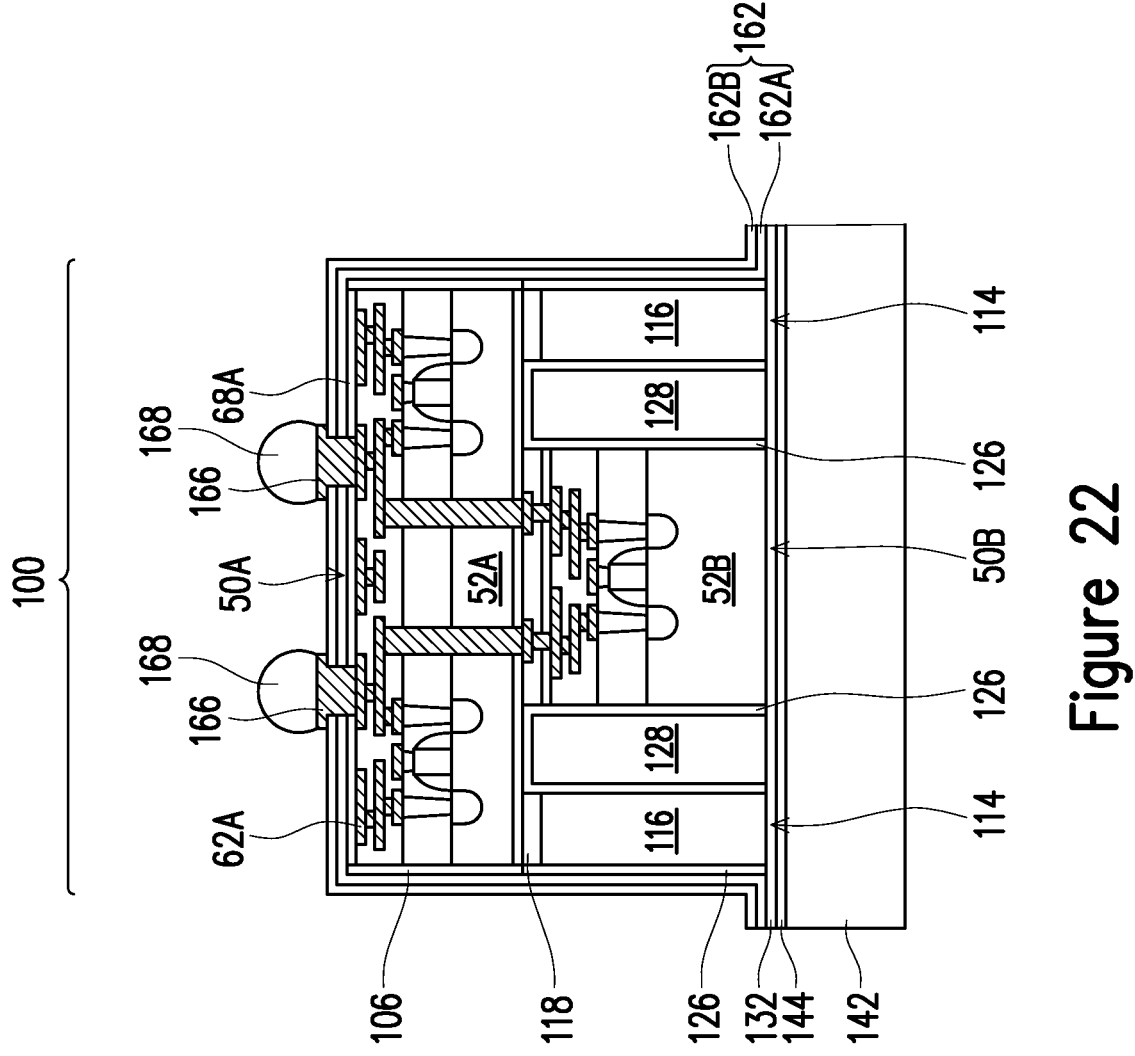

In FIG. 22, a singulation process is performed on the portions of the passivation layer(s) 162, the etch stop layer 132, the bonding film 144, and the support substrate 142 in the scribe line regions 102S. The singulation process may include a mechanical process such as a sawing process, a cutting process, or the like. The liners 106, 126 and the gap-filling dielectrics 108, 128 are separated before the singulation process, and thus are not affected by the mechanical process. The singulation process singulates the package regions 102P from one another. The resulting, singulated integrated circuit package 100 is from one of the package regions 102P. After the singulation process, the singulated portions of the passivation layer(s) 162, the etch stop layer 132, the bonding film 144, and the support substrate 142 are laterally coterminous.

Conductive connectors 168 are optionally formed on the die connectors 166. The conductive connectors 168 may be formed before or after the singulation process. The conductive connectors 168 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 168 may include a conductive material such as solder, copper, aluminum, gold, nickel, silver, palladium, tin, the like, or a combination thereof. In some embodiments, the conductive connectors 168 are formed by initially forming a layer of a reflowable material (e.g., solder) through evaporation, electroplating, printing, solder transfer, ball placement, or the like. Once a layer of solder has been formed on the structure, a reflow may be performed in order to shape the material into the desired bump shapes. The conductive connectors 168 may be subsequently utilized to connect the integrated circuit package 100 to another component, such as an interposer, a packing substrate, or the like.

The integrated circuit package 100 is a component that may be subsequently implemented in an integrated circuit device. In some embodiments, an integrated circuit device is formed by attaching the integrated circuit package 100 to another component, such as an interposer, a packing substrate, or the like. In some embodiments, an integrated circuit device is formed by encapsulating the integrated circuit package 100 and forming redistribution lines on the encapsulant to fan-out connections from the integrated circuit package 100. The integrated circuit dies 50 of the integrated circuit package 100 may be heterogeneous dies. Packaging the integrated circuit package 100 in lieu of or in addition to packaging dies individually may allow heterogeneous dies to be integrated with a smaller footprint.

Figure 23:
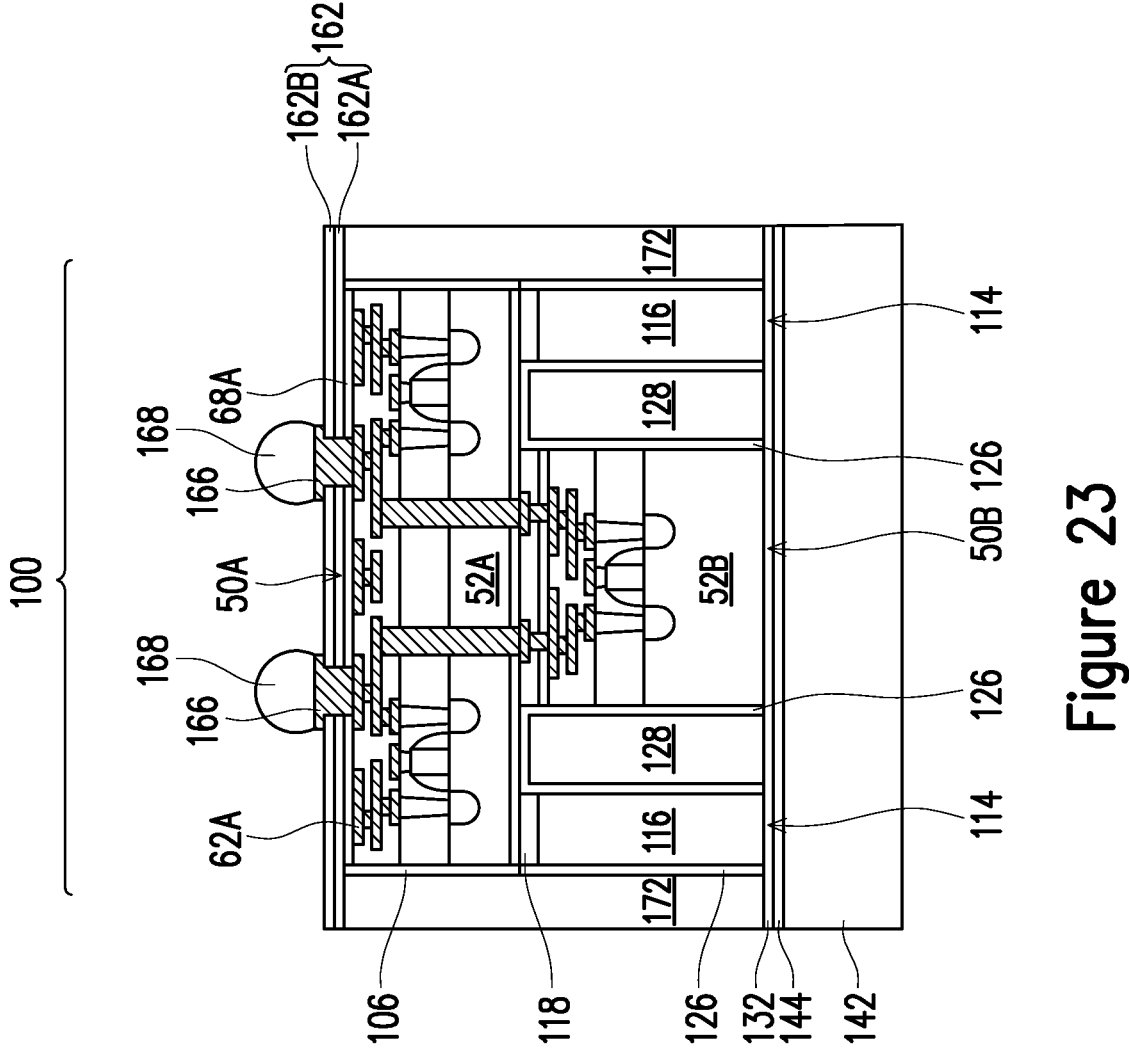
FIG. 23 is a cross-sectional view of an integrated circuit package, in accordance with some other embodiments.

FIG. 23 is a cross-sectional view of an integrated circuit package 100, in accordance with some other embodiments. This embodiment is similar to the embodiment of FIG. 22, except an epoxy material such as a molding compound 172 is formed around the various components of the integrated circuit package 100 after the removal process 152. The molding compound 172 may be applied by compression molding, transfer molding, or the like. The molding compound 172 may be formed before the passivation layer(s) 162, such that the passivation layer(s) 162 are formed on the molding compound 172. As such, the molding compound 172 extends along the outer sidewalls of the dummy semiconductor features 114 and the outer sidewalls of the integrated circuit die 50A. The liners 106 are between the molding compound 172 and the outer sidewalls of the integrated circuit die 50A. The liners 126 are between the molding compound 172 and the outer sidewalls of the dummy semiconductor features 114. Further, the passivation layer(s) 162 extend along the top surfaces of the integrated circuit die 50A and the molding compound 172.

Figure 24:
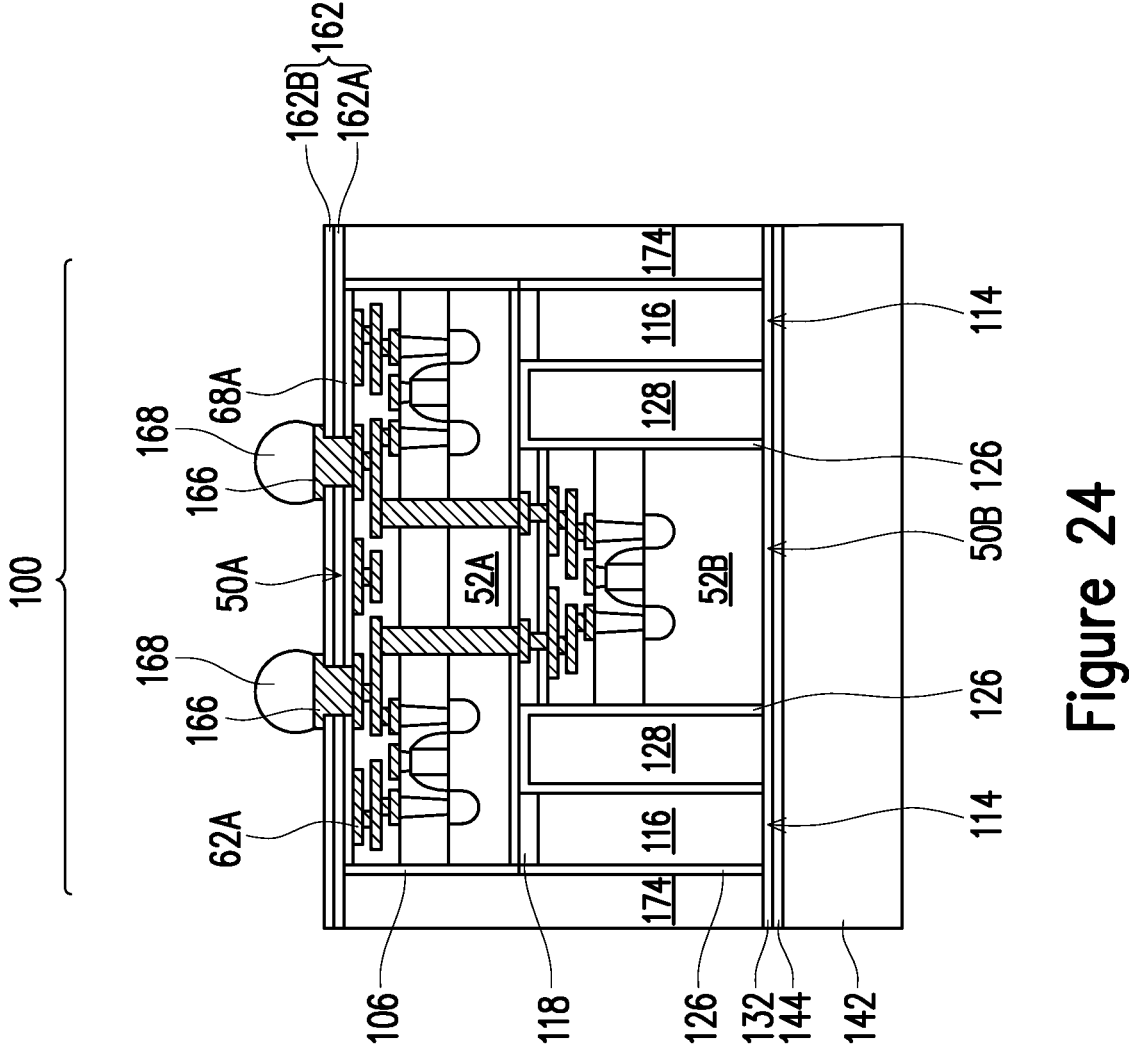
FIG. 24 is a cross-sectional view of an integrated circuit package, in accordance with some other embodiments.

FIG. 24 is a cross-sectional view of an integrated circuit package 100, in accordance with some other embodiments. This embodiment is similar to the embodiment of FIG. 22, except an epoxy material such as an underfill 174 is formed around the various components of the integrated circuit package 100 after the removal process 152. The underfill 174 may be applied by a capillary flow process, a deposition process, or the like. The underfill 174 may be formed before the passivation layer(s) 162, such that the passivation layer(s) 162 are formed on the underfill 174. In this embodiment, the underfill 174 extends along the outer sidewalls of the dummy semiconductor features 114 and the outer sidewalls of the integrated circuit die 50A. The liners 106 are between the underfill 174 and the outer sidewalls of the integrated circuit die 50A. The liners 126 are between the underfill 174 and the outer sidewalls of the dummy semiconductor features 114. Further, the passivation layer(s) 162 extend along the top surfaces of the integrated circuit die 50A and the underfill 174.

Figure 25:
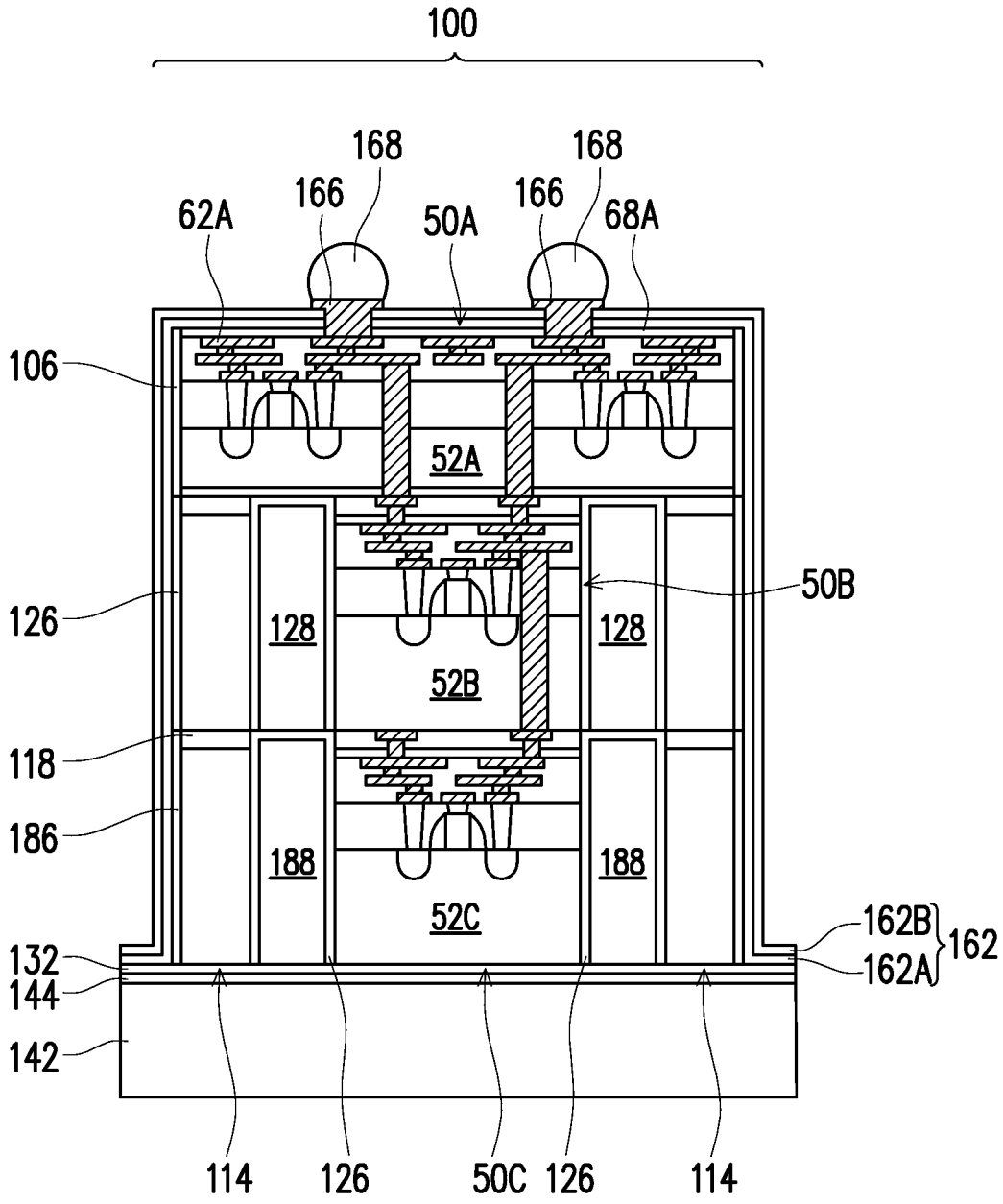
FIG. 25 is a cross-sectional view of an integrated circuit package, in accordance with some other embodiments.
Figure 26:
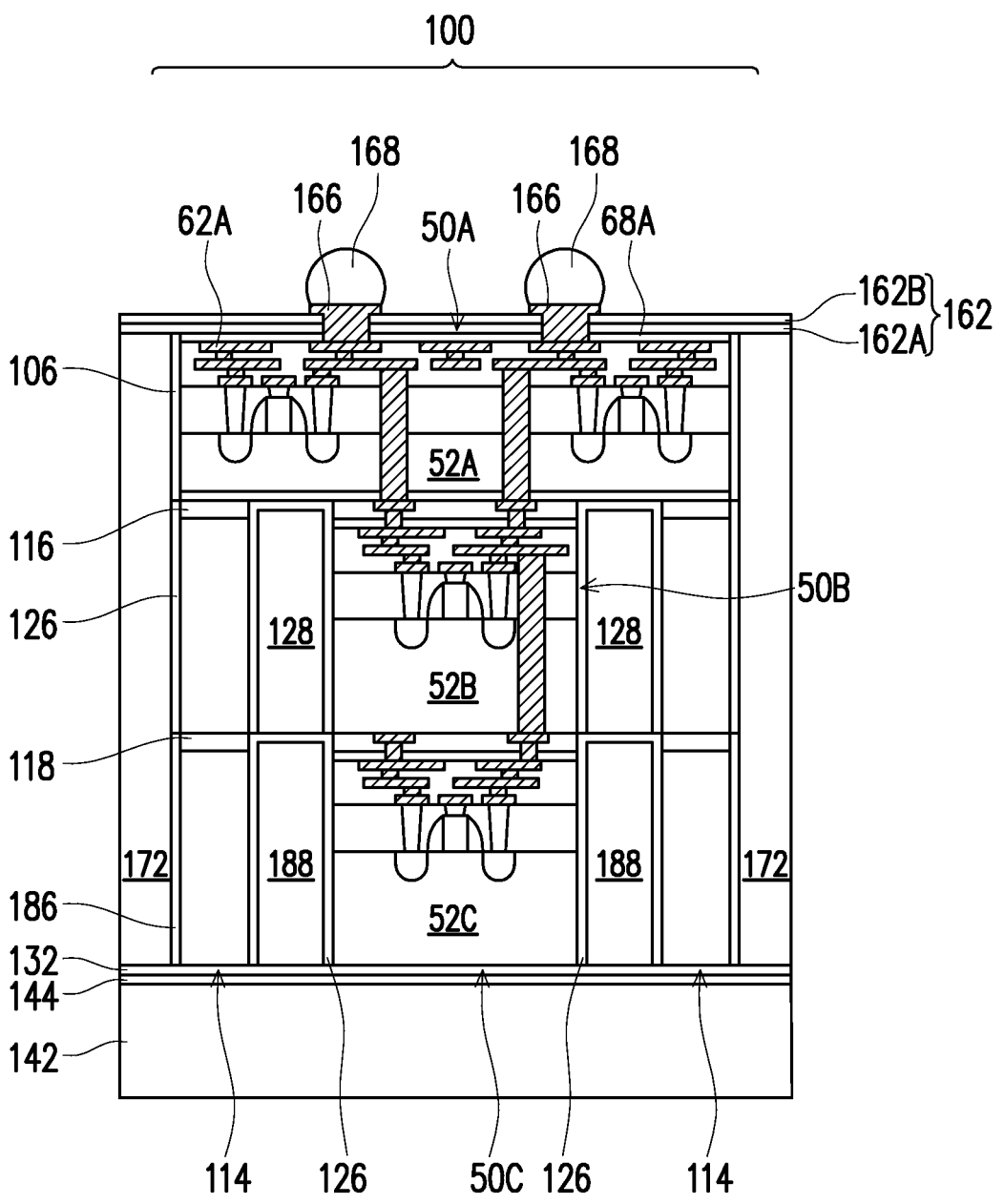
FIG. 26 is a cross-sectional view of an integrated circuit package, in accordance with some other embodiments.
Figure 27:
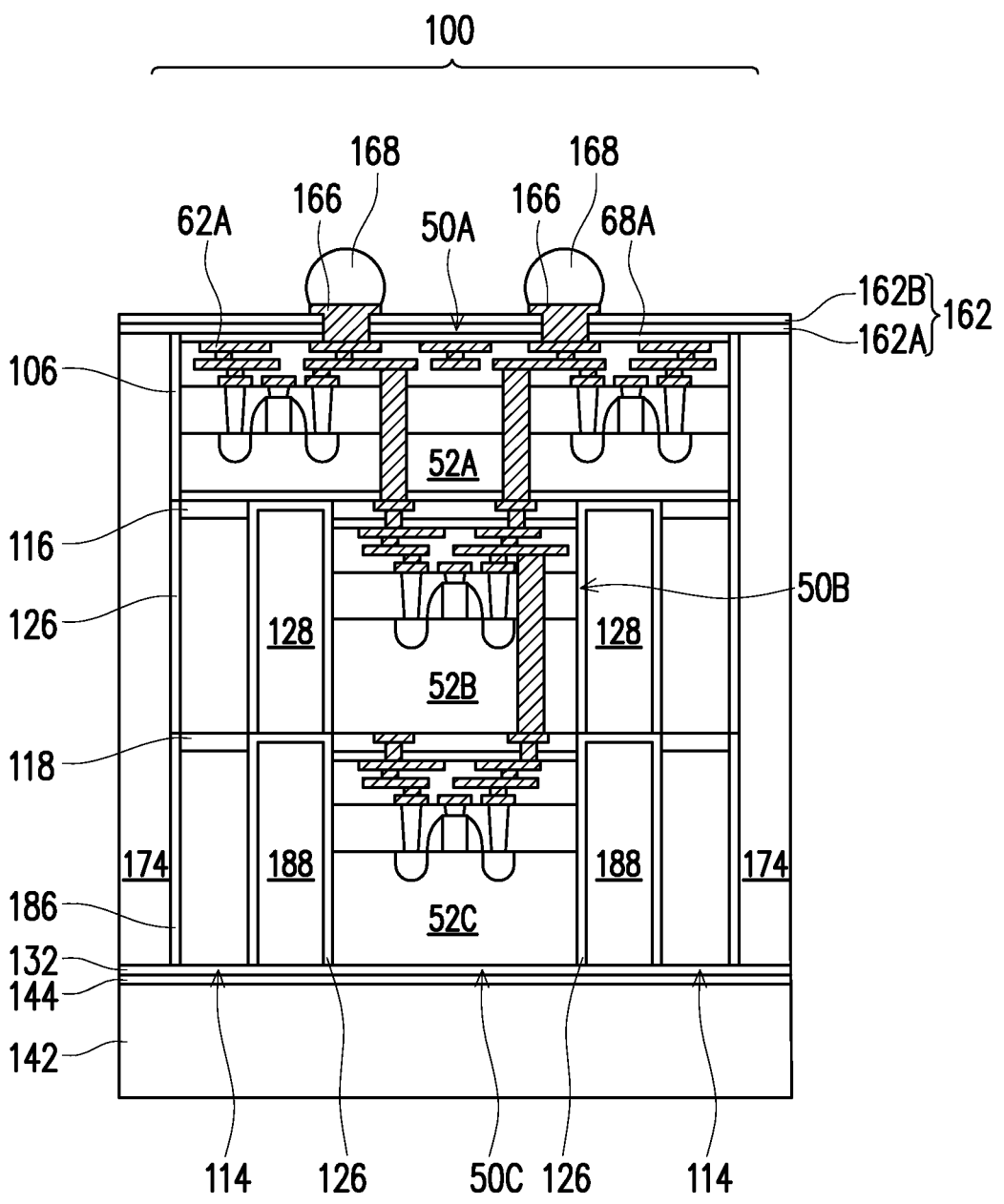
FIG. 27 is a cross-sectional view of an integrated circuit package, in accordance with some other embodiments.

FIGS. 25-27 are cross-sectional views of integrated circuit packages 100, in accordance with some other embodiments. The embodiments of FIGS. 25-27 are similar to the embodiments described for FIGS. 22-24, respectively, except the integrated circuit packages 100 each include more than two layers of integrated circuit dies 50, such as three layers of integrated circuit dies 50. Conductive vias 66 may be formed in appropriate ones of the integrated circuit dies 50 (e.g., integrated circuit dies 50A, 50B) to facilitate connection to other ones of the integrated circuit dies 50 (e.g., integrated circuit dies 50B, 50C). An additional liner 186 and gap-filling dielectric 188 are formed around the integrated circuit die 50C. In some embodiments, the gap-filling dielectric 188 is formed of the same dielectric material as the gap-filling dielectrics 108, 128. In some embodiments, the liner 186 is formed of the same dielectric material as the liners 106, 126.

Embodiments may achieve advantages. Separating portions of the integrated circuit packages 100 with the removal process 152 (e.g., a chemical process) may reduce damage to the integrated circuit packages 100 during a singulation process (e.g., a mechanical process). Specifically, utilizing a chemical process (instead of a mechanical process) to remove the gap-filling dielectrics 108, 128 from the scribe line regions 102S can reduce the risk of cracks forming in the gap-filling dielectrics 108, 128. The risk of cracks forming and spreading to other features of the integrated circuit packages 100 may thus be reduced. Reliability of the resulting integrated circuit packages 100 during testing or operation may thus be improved.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a device includes: a first integrated circuit die; a second integrated circuit die bonded to the first integrated circuit die in a face-to-back manner; a dummy semiconductor feature adjacent the second integrated circuit die and bonded to the first integrated circuit die; a support substrate attached to the dummy semiconductor feature and the second integrated circuit die; and a passivation layer extending along a top surface of the support substrate, an outer sidewall of the dummy semiconductor feature, an outer sidewall of the first integrated circuit die, and a top surface of the first integrated circuit die. In some embodiments, the device further includes: a gap-filling dielectric between the second integrated circuit die and the dummy semiconductor feature. In some embodiments, the device further includes: a liner between the gap-filling dielectric and each of the second integrated circuit die and the dummy semiconductor feature. In some embodiments of the device, an outer sidewall of the dummy semiconductor feature is aligned with an outer sidewall of the first integrated circuit die. In some embodiments, the device further includes: a first liner between the passivation layer and the outer sidewall of the dummy semiconductor feature; and a second liner between the passivation layer and the outer sidewall of the first integrated circuit die. In some embodiments of the device, an outer sidewall of the second liner is aligned with an outer sidewall of the first liner. In some embodiments, the device further includes: a die connector extending through the passivation layer, the die connector connected to the first integrated circuit die. In some embodiments, the device further includes: an etch stop layer between the support substrate and the passivation layer, where the support substrate is bonded to the etch stop layer through an oxide layer.

In an embodiment, a device includes: a first integrated circuit die; a second integrated circuit die bonded to the first integrated circuit die in a face-to-back manner; a dummy semiconductor feature adjacent the second integrated circuit die and bonded to the first integrated circuit die; an epoxy material extending along an outer sidewall of the dummy semiconductor feature, an outer sidewall of the first integrated circuit die, and a top surface of the first integrated circuit die; a first liner between the epoxy material and the outer sidewall of the dummy semiconductor feature; and a second liner between the epoxy material and the outer sidewall of the first integrated circuit die. In some embodiments of the device, the epoxy material is a molding compound. In some embodiments of the device, the epoxy material is an underfill.

In an embodiment, a method includes: forming a first gap-filling dielectric around a first integrated circuit die; bonding a second integrated circuit die to the first integrated circuit die; forming a second gap-filling dielectric around the second integrated circuit die; attaching a support substrate to the second gap-filling dielectric and the second integrated circuit die; removing the first gap-filling dielectric and the second gap-filling dielectric with a chemical process; and singulating the support substrate with a mechanical process. In some embodiments of the method, the first gap-filling dielectric and the second gap-filling dielectric include a first dielectric material, the method further including: forming a liner around the second integrated circuit die, the second gap-filling dielectric formed on the liner, the liner including a second dielectric material, the second dielectric material different from the first dielectric material. In some embodiments of the method, the first dielectric material is silicon oxide and the second dielectric material is silicon nitride. In some embodiments of the method, the chemical process includes: etching the first gap-filling dielectric with a first etch that selectively etches the first dielectric material at a faster rate than the second dielectric material; etching the liner with a second etch that selectively etches the second dielectric material at a faster rate than the first dielectric material; and etching the second gap-filling dielectric with a third etch that selectively etches the first dielectric material at a faster rate than the second dielectric material. In some embodiments of the method, the first etch and the third etch are wet etches, and the second etch is a dry etch. In some embodiments, the method further includes: forming an etch stop layer on the second gap-filling dielectric and the second integrated circuit die, the support substrate attached to the etch stop layer, the etch stop layer including the second dielectric material. In some embodiments of the method, the chemical process further includes: forming a mask covering the first integrated circuit die, the mask including an opening, where the first etch, the second etch, and the third etch each extend the opening. In some embodiments of the method, the mechanical process includes: sawing or cutting the support substrate. In some embodiments, the method further includes: after the chemical process and before the mechanical process, depositing a passivation layer on a top surface and an outer sidewall of the first integrated circuit die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first gap-filling dielectric around a first integrated circuit die;

bonding a second integrated circuit die to the first integrated circuit die;

forming a liner around the second integrated circuit die;

forming a second gap-filling dielectric on the liner and around the second integrated circuit die, the first gap-filling dielectric and the second gap-filling dielectric comprising a first dielectric material, the liner comprising a second dielectric material, the second dielectric material being different from the first dielectric material;

attaching a support substrate to the second gap-filling dielectric and the second integrated circuit die;

removing the first gap-filling dielectric and the second gap-filling dielectric with a chemical process, wherein the chemical process comprises:

etching the first gap-filling dielectric with a first etch that selectively etches the first dielectric material at a faster rate than the second dielectric material;

etching the liner with a second etch that selectively etches the second dielectric material at a faster rate than the first dielectric material; and etching the second gap-filling dielectric with a third etch that selectively etches the first dielectric material at a faster rate than the second dielectric material; and singulating the support substrate with a mechanical process.

2. The method of claim 1, wherein the first dielectric material is silicon oxide and the second dielectric material is silicon nitride.

3. The method of claim 1, wherein the first etch and the third etch are wet etches, and the second etch is a dry etch.

4. The method of claim 1, further comprising:

forming an etch stop layer on the second gap-filling dielectric and the second integrated circuit die, the support substrate attached to the etch stop layer, the etch stop layer comprising the second dielectric material.

5. The method of claim 1, wherein the chemical process further comprises:

forming a mask covering the first integrated circuit die, the mask comprising an opening, wherein the first etch, the second etch, and the third etch each extend the opening.

6. The method of claim 1, wherein the mechanical process comprises:

sawing or cutting the support substrate.

7. The method of claim 1, further comprising:

after the chemical process and before the mechanical process, depositing a passivation layer on a top surface and along an outer sidewall of the first integrated circuit die.

8. A method comprising:

forming a liner around an integrated circuit die;

forming a gap-filling dielectric on the liner and around the integrated circuit die, the gap-filling dielectric comprising a first dielectric material, the liner comprising a second dielectric material, the second dielectric material being different from the first dielectric material;

attaching a support substrate to the gap-filling dielectric and the integrated circuit die;

removing the gap-filling dielectric with a chemical process, wherein the chemical process comprises:

etching the gap-filling dielectric with a wet etch that selectively etches the first dielectric material at a faster rate than the second dielectric material; and etching the liner with a dry etch that selectively etches the second dielectric material at a faster rate than the first dielectric material;

depositing a passivation layer on a top surface and an outer sidewall of the integrated circuit die; and singulating the passivation layer and the support substrate with a mechanical process.

9. The method of claim 8, wherein the chemical process comprises:

forming a mask covering the integrated circuit die, the mask comprising an opening; and extending the opening through the gap-filling dielectric with an etch.

10. The method of claim 8, wherein the mechanical process comprises:

sawing or cutting the passivation layer and the support substrate.

11. A method comprising:

forming a first gap-filling dielectric around a first integrated circuit die;

bonding a second integrated circuit die to the first integrated circuit die;

forming a liner around the second integrated circuit die;

forming a second gap-filling dielectric on the liner and around the second integrated circuit die;

attaching a support substrate to the second gap-filling dielectric and the second integrated circuit die;

forming an opening by:

removing the first gap-filling dielectric with a first etch;

removing the liner with a second etch; and removing the second gap-filling dielectric with a third etch, the second etch being different from the first etch and different from the third etch;

forming an epoxy material in the opening; and singulating the epoxy material and the support substrate with a mechanical process.

12. The method of claim 11, wherein forming the epoxy material in the opening comprises molding a molding compound in the opening.

13. The method of claim 11, wherein forming the epoxy material in the opening comprises flowing an underfill in the opening.

14. The method of claim 11, further comprising:

depositing a passivation layer on a top surface of the epoxy material and on a top surface of the first integrated circuit die.

15. The method of claim 14, further comprising:

forming a die connector through the passivation layer, the die connector connected to the first integrated circuit die.

16. The method of claim 11, wherein the first etch and the third etch are wet etches, and the second etch is a dry etch.

17. The method of claim 11, wherein the first gap-filling dielectric and the second gap-filling dielectric comprise silicon oxide, and the liner comprises silicon nitride.

18. The method of claim 17, wherein the first etch and the third etch are performed with hydrofluoric acid, and the second etch is performed with carbon tetrafluoride.

19. The method of claim 11, wherein the first etch selectively etches the first gap-filling dielectric at a faster rate than the liner, the second etch selectively etches the liner at a faster rate than the second gap-filling dielectric, and the third etch selectively etches the second gap-filling dielectric at a faster rate than the liner.

20. The method of claim 11, further comprising:

forming a mask covering the first integrated circuit die and the second integrated circuit die, the mask having a pattern of the opening.

* * * * *